(12) United States Patent
Oosaki et al.

(10) Patent No.: US 8,003,940 B2
(45) Date of Patent: *Aug. 23, 2011

(54) TOOL-TO-TOOL MATCHING CONTROL METHOD AND ITS SYSTEM FOR SCANNING ELECTRON MICROSCOPE

(75) Inventors: Mayuka Oosaki, Yokohama (JP); Chie Shishido, Yokohama (JP); Hiroki Kawada, Tsuchiura (JP); Tatsuya Maeda, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 240 days.

This patent is subject to a terminal disclaimer.

(21) Appl. No.: 12/349,751

(22) Filed: Jan. 7, 2009

(65) Prior Publication Data

US 2009/0121134 A1 May 14, 2009

Related U.S. Application Data

(63) Continuation of application No. 11/583,886, filed on Oct. 20, 2006, now Pat. No. 7,476,857.

(30) Foreign Application Priority Data

Oct. 27, 2005 (JP) ................................. 2005-312316

(51) Int. Cl.
*H01J 37/28* (2006.01)
*H01J 37/256* (2006.01)
*G01N 23/00* (2006.01)

(52) U.S. Cl. ........ 250/310; 250/311; 250/306; 250/307; 250/492.2; 250/492.22

(58) Field of Classification Search .................. 250/310, 250/311, 306, 307, 492.2, 492.22
See application file for complete search history.

(56) References Cited

U.S. PATENT DOCUMENTS

| 6,746,882 | B1 * | 6/2004 | Stirton et al. | .................... 438/14 |
| 7,399,964 | B2 | 7/2008 | Shishido | |
| 7,408,154 | B2 * | 8/2008 | Oosaki et al. | ................. 250/307 |
| 7,408,155 | B2 | 8/2008 | Oosaki | |
| 7,476,857 | B2 * | 1/2009 | Oosaki et al. | ................. 250/310 |

FOREIGN PATENT DOCUMENTS

JP 05-248843 9/1993

* cited by examiner

*Primary Examiner* — Nikita Wells
(74) *Attorney, Agent, or Firm* — Antonelli, Terry, Stout & Kraus, LLP.

(57) ABSTRACT

A system for controlling a tool-to-tool disparity between a plurality of scanning electron microscopes includes a measuring unit for measuring a tool-to-tool disparity between plural scanning electron microscopes based on information extracted from secondary electron images which are captured by imaging a reference pattern formed on a wafer, a tool state monitoring unit for monitoring tool states of each of the plural scanning electron microscopes, and an output unit for displaying on a screen a relationship between the tool-to-tool disparity between the plural scanning electron microscopes and tool states of each of the plural scanning electron microscopes monitored by the tool state monitoring unit. The tool state monitoring unit monitors the tool states of each of the plural scanning electron microscopes while imaging the reference pattern formed on the wafer by using each of the plural scanning electron microscopes.

7 Claims, 22 Drawing Sheets

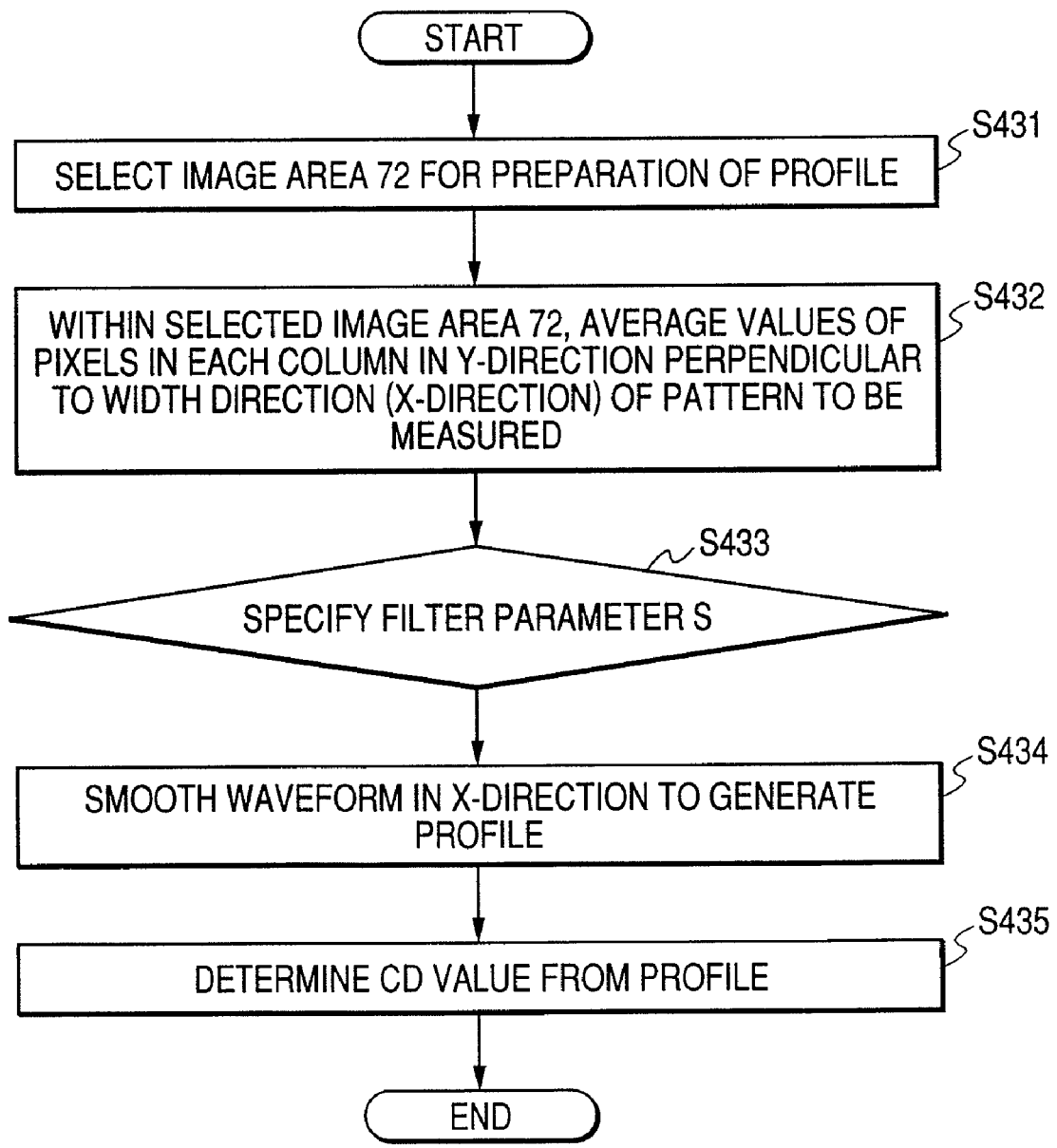

FIG. 8

ACQUIRE DATA FOR FOR EVALUATION OF
TOOL-TO-TOOL DISPARITY CAUSING FACTORS

START

US 8,003,940 B2

TOOL-TO-TOOL MATCHING CONTROL METHOD AND ITS SYSTEM FOR SCANNING ELECTRON MICROSCOPE

CROSS REFERENCE TO RELATED APPLICATION

This application is a continuation of U.S. application Ser. No. 11/583,886, filed Oct. 20, 2006, now U.S. Pat. No. 7,476, 857, the contents of which are incorporated herein by reference.

BACKGROUND OF THE INVENTION

The present invention relates to a scanning electron microscope for measuring micropattern dimensions, and more particularly to a scanning electron microscope system having a function to control, or correct, a disparity in dimension measurements between measuring scanning electron microscopes, as well as controlling, or correcting, a variation in dimension measurements obtained by a microscope over time. (Such a disparity or variation may be hereinafter referred to as a "tool-to-tool disparity"). The present invention also relates to a tool-to-tool machine control system including scanning electron microscopes and a tool-to-tool matching control apparatus for scanning electron microscopes having such a function.

As semiconductor device patterns have been scaled down in semiconductor manufacturing processes, there has been a need for a dimension measuring apparatus having higher measurement accuracy. The demands related to measurement accuracy include increasing the measurement accuracy of individual measuring apparatuses, reducing disparities in dimension measurements between a plurality of measuring apparatuses provided in a production line, and reducing variations in dimension measurements obtained by a measuring apparatus over time.

Scanning electron microscopes (SEMs) for measuring micropattern width, referred to as "length measuring SEMs" or "critical dimension SEMs" (or "CDSEMs"), have been used to measure the width of micropatterns on the order of a few tens of nanometers. These scanning electron microscopes are capable of capturing a micropattern image at a magnification of a few tens of thousands of times to three hundred thousand times.

Attempts have been made to correct or reduce tool-to-tool disparities in dimension measurements between such measuring scanning electron microscopes or correct or reduce variations in dimension measurements obtained by such a scanning electron microscope over time by correcting the measured values themselves, instead of calibrating the microscopes.

Specifically, Japanese Laid-Open Patent Publication No. 5-248843 (1993) discloses a scanning electron microscope that performs the following steps: for each test sample under each test measurement condition (at each different magnification), finding a correction equation y=a*x+b based on the design value and length measurements; saving these found correction equations from the terminal unit to a disk storage device; and when an actual sample is measured under a given measurement condition, retrieving the correction equation matching this sample and measurement condition, and correcting length measurements using the selected correction equation.

SUMMARY OF THE INVENTION

Thus, in order to reduce disparities in dimension measurements between a plurality of measuring scanning electron microscopes or reduce variations in dimension measurements obtained by a scanning electron microscope over time, the technique disclosed in the above patent publication corrects the measured values of pattern dimensions (instead of calibrating the microscopes). The reason for this is that scanning electron microscopes are very sophisticated devices and hence it is not easy to pinpoint a factor that has caused a tool-to-tool disparity of a nanometer or less, which is currently being demanded. In reality, however, since the appropriate correction method for dimension measurements may vary depending on the factor that has caused the tool-to-tool disparity, pattern dimension correction cannot be properly carried out without knowing this factor.

The present invention relates to a tool-to-tool matching control system for scanning electron microscopes and a method therefor capable of quickly estimating a factor(s) that has caused a variation (or tool-to-tool disparity) in dimension measurements between a plurality of measuring scanning electron microscopes or a variation in dimension measurements obtained by a scanning electron microscope over time, and calibrating these scanning electron microscopes based on the estimation results to reduce such a tool-to-tool disparity in order to allow highly accurate control of the dimensions of patterns.

The present invention provides a system and method for controlling a variation in dimension measurements (or a tool-to-tool disparity) between a plurality of scanning electron microscopes for pattern dimension measurement, the system comprising: measuring means for, at regular intervals, measuring a tool-to-tool disparity between microscopes based on secondary electron image, and, measuring indicators indicating states of the microscopes (that is, image features in the secondary electron image data and/or device state parameters of the microscopes), the secondary electron image data being captured by imaging a reference wafer by use of the microscopes; a tool-to-tool disparity causing factor analyzing unit for analyzing a relationship between the tool-to-tool disparity and the values of the indicators measured by the measuring means to estimate a factor that has caused the tool-to-tool disparity; and output means for displaying and outputting the tool-to-tool disparity causing factor estimated by the tool-to-tool disparity causing factor analyzing unit.

Further, the present invention also provides a system and method for controlling a variation (or tool-to-tool disparity) in dimension measurements obtained at a series of times (over time) by a scanning electron microscope for pattern dimension measurement, the system comprising: measuring means for measuring a variation (or tool-to-tool disparity) in dimension measurements obtained based on secondary electron image data captured by imaging a reference wafer at a series of times by use of a scanning electron microscope, and further measuring indicators indicating states of the microscope (that is, image features in the secondary electron image data and/or device state parameters of the microscope); a tool-to-tool-disparity causing factor analyzing unit for analyzing a relationship between the variation and the values of the indicators measured by the measuring means to estimate a factor that has caused the variation, the indicators indicating the states of the microscope; and output means for displaying and outputting the variation causing factor (or tool-to-tool disparity causing factor) estimated by the tool-to-tool disparity causing factor analyzing unit.

Further, the present invention also provides a system and method for: storing in a database a relationship between candidate tool-to-tool disparity causing factors and device control parameters for adjusting the candidate tool-to-tool disparity causing factors; based on the relationship stored in the database, selecting an appropriate device control parameter for an estimated tool-to-tool disparity causing factor; and automatically adjusting the selected device control parameter for each microscope by an appropriate amount to reduce the tool-to-tool disparity between the microscopes.

Thus, the present invention provides a tool-to-tool matching control system for scanning electron microscopes and a method therefor capable of quickly estimating a factor(s) that has caused a variation (or tool-to-tool disparity) in dimension measurements between a plurality of measuring scanning electron microscopes or a variation in dimension measurements obtained by a scanning electron microscope over time, and adjusting these scanning electron microscopes based on the estimation results to reduce such a tool-to-tool disparity. This leads to highly accurate control of the dimensions of patterns and hence to enhanced performance of the product.

These and other objects, features and advantages of the invention will be apparent from the following more particular description of preferred embodiments of the invention, as illustrated in the accompanying drawings.

BRIEF DESCRIPTION OF THE DRAWINGS

FIG. 6 is a flowchart specifically showing step S43 of FIG. 4, illustrating a sequence for calculating a CD value from secondary electron image data in order to estimate a factor that has caused a tool-to-tool disparity.

FIG. 8 is a diagram showing an exemplary icon (or button) displayed by the input/output unit of each scanning electron microscope of the present invention, wherein the button is pressed by the user to obtain data for evaluation of tool-to-tool disparity causing factors.

DESCRIPTION OF THE PREFERRED EMBODIMENTS

Figure 1:
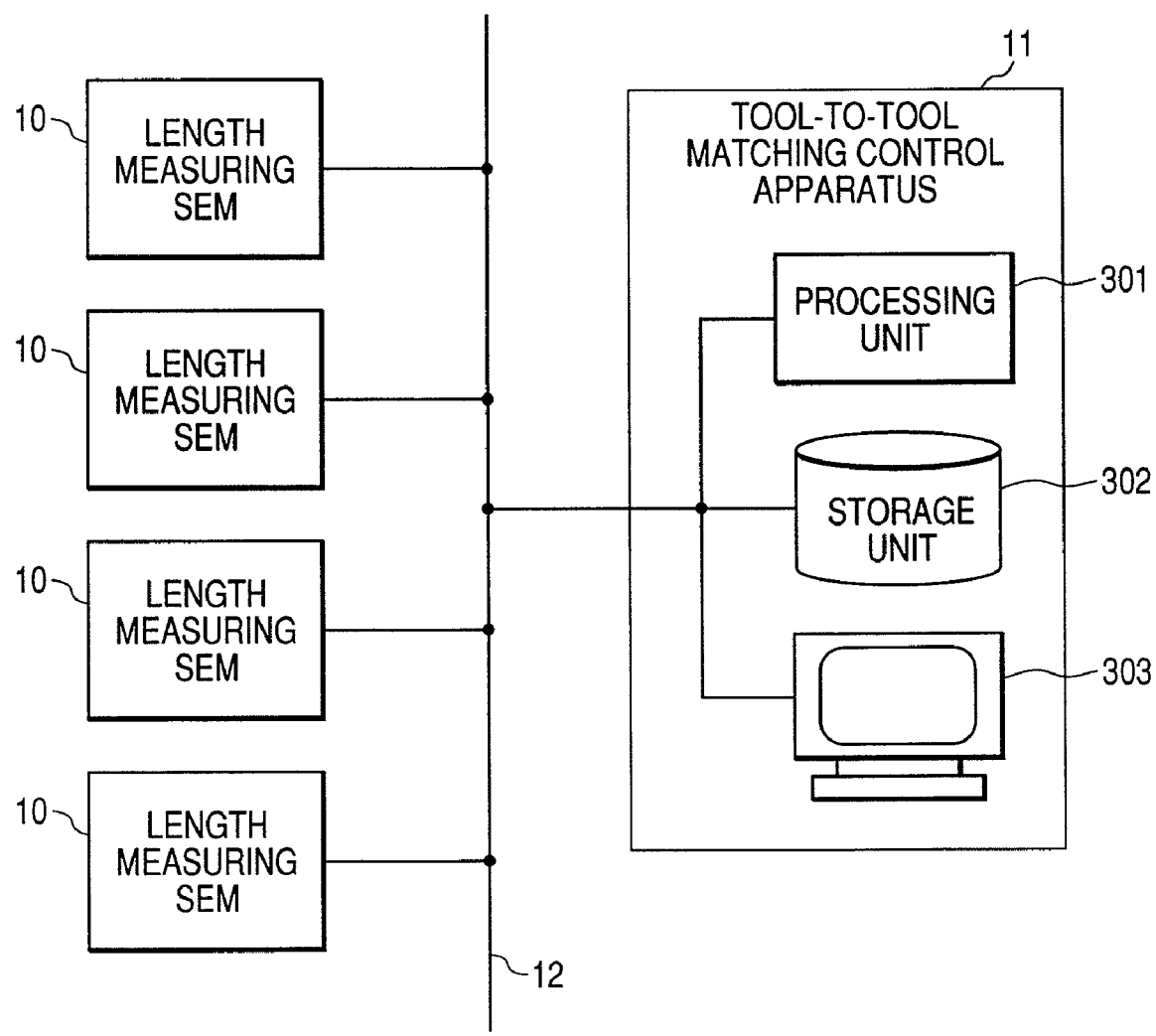
FIG. 1 is a diagram schematically showing the configuration of a first exemplary tool-to-tool matching control system including scanning electron microscopes according to a first embodiment of the present invention.

There will now be described scanning electron microscopes (length measuring SEMs or CDSEMs), tool-to-tool matching control systems containing scanning electron microscopes, and tool-to-tool matching control apparatuses for scanning electron microscopes according to the present invention with reference to the accompanying drawings.

The present invention relates to a scanning electron microscope system including a plurality of scanning electron microscopes for measuring the dimensions of a micropattern based on a captured image of the micropattern. An object of the present invention is to reduce variations in dimension measurements between these measuring microscopes. It should be noted that a variation in dimension measurements (namely, CD values) between measuring microscopes is hereinafter referred to as a "tool-to-tool disparity."

First Embodiment

It is not easy to pinpoint a factor that has caused a variation in dimension measurements between measuring scanning electron microscopes (length measuring SEMs or CDSEMs) of the present invention, since they have a sophisticated configuration.

A first embodiment of the present invention has been devised to address this problem. The first embodiment of the present invention is characterized in that image features in secondary electron image data captured by scanning electron microscopes are used as indicators for indicating states of the microscopes in order to evaluate, or examine, tool-to-tool disparity causing factors. Specifically, to evaluate tool-to-tool disparity causing factors, for example, the present embodiment monitors the following image features in secondary electron image data captured by microscopes: image brightness information Ca (for example, average gray value); image contrast Cb (for example, the difference between the highest and lowest gray values); image noise level Cc; tilt indicator value Cd; pitch Ce of a repeated pattern; resolution evaluation indicator value Cf calculated based on the image; and axial alignment (astigmatic adjustment) indicator value Cg calculated based on the image. The values of these monitored features are compared with the dimension values (CD values) measured by the microscopes to determine their correlation or perform principal component analysis in order to identify a factor(s) that has caused the tool-to-tool disparity. Factors causing a tool-to-tool disparity include: image brightness difference Fa; image contrast difference Fb; image noise level difference Fc; relative tilt angle Fd; image magnification difference Fe; resolution difference Ff; and axial alignment (astigmatic adjustment) accuracy difference Fg. Then, for example, the following device control (or adjustment) parameters of each microscope may be automatically corrected based on the comparison results: the photomultiplier tube gain Pa and probe current Pb; the probe current Pc; the tilt control value of the deflection coil and stage tilt angle (or stage installation angle), Pd; the deflection coil magnification control value Pe; the objective lens control value, retarding control value, and aperture (changed by replacing the mechanism), Pf; and the axial alignment coil (astigmatic adjustment coil) control value Pg. Specifically, a tool-to-tool disparity correction process may be performed as follows. Each microscope captures an image of a repeated pattern, and the pitch Ce of the pattern is measured from the image. Then, the correlation between the dimension measurements, namely, CD values, obtained by the microscopes and the measured values of the pitch Ce is calculated. If this correlation is high, a factor that has caused the tool-to-tool disparity (or the variation in the dimension measurements) is considered to be the magnification difference Fe between the microscopes. Therefore, the deflection coil magnification control value Pe (that is, the control parameter of the device for setting the magnification of the image) may be adjusted to reduce the tool-to-tool disparity.

First Example

There will now be described a first exemplary tool-to-tool matching control system including scanning electron microscopes according to the first embodiment of the present invention capable of calibrating these microscopes to reduce tool-to-tool disparities between them.

(1) System Configuration

FIG. 1 shows the configuration of the first exemplary tool-to-tool matching control system including scanning electron microscopes according to the present invention. This system is made up primarily of a plurality of scanning electron microscopes (length measuring SEMs or CDSEMs) 10 and a tool-to-tool matching control apparatus 11 for controlling, or correcting, tool-to-tool disparities between these microscopes. The microscopes 10 and the tool-to-tool matching control apparatus 11 are connected to each other by a data bus, or network, 12.

Figure 2:
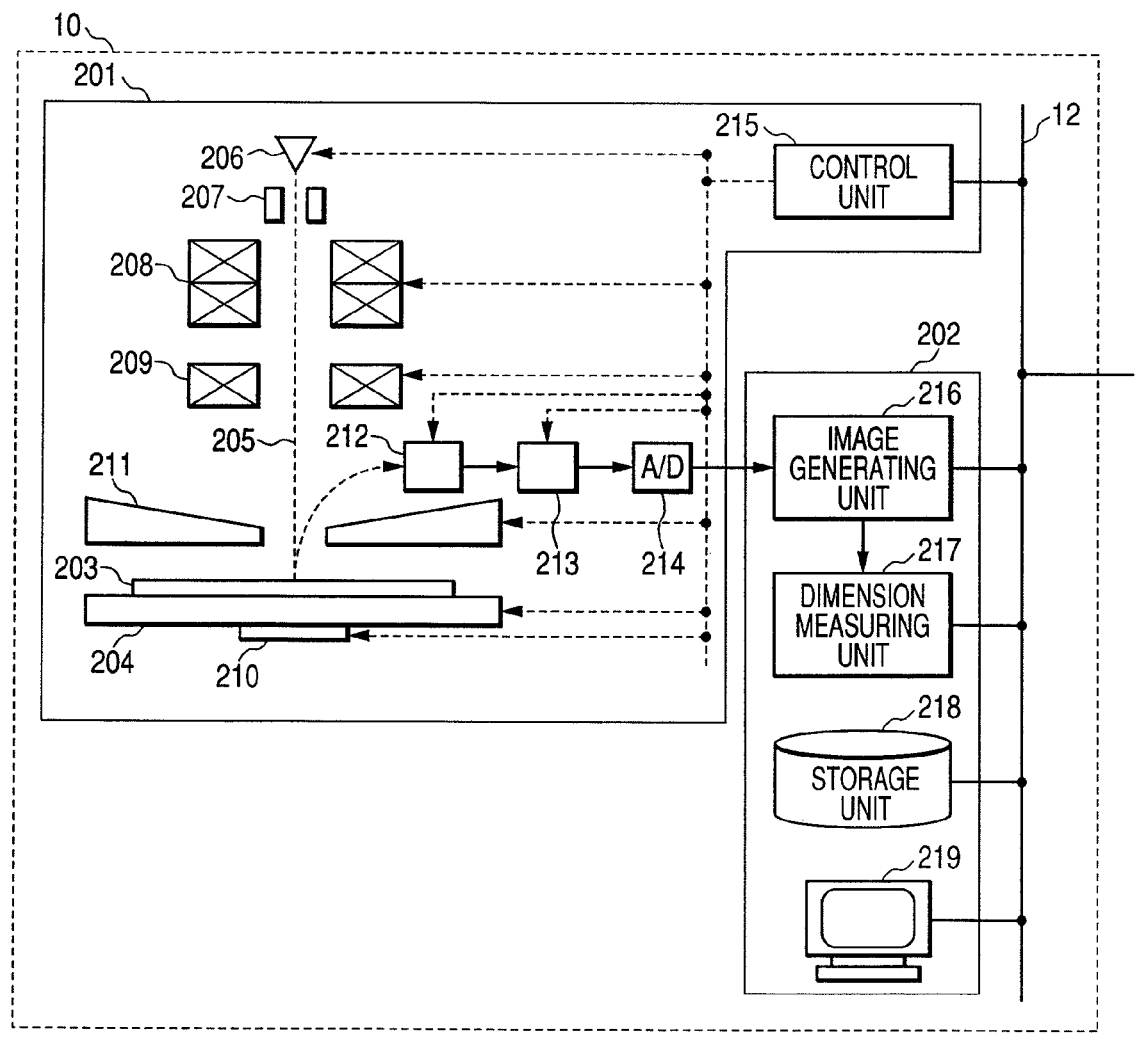
FIG. 2 is a diagram showing an exemplary configuration of the individual scanning electron microscopes shown in FIG. 1.

FIG. 2 shows an exemplary configuration of the individual scanning electron microscopes 10 shown in FIG. 1. Each scanning electron microscope 10 is made up of two major portions: an electron optical system 201 for capturing an electron beam image; and an information processing system 202 for processing the captured image to measure a target pattern in the image.

The electron optical system 201 primarily includes: a stage 204 on which a sample 203 is mounted; an electron gun 206 for emitting an electron beam 205; an aperture 207 for guiding the electron beam and reducing its diameter; a deflector lens 208 for deflecting the electron beam; an objective lens 209 for adjusting the focal point of the electron beam; a retarding electrode 210; a booster 211 for pulling up the secondary electrons emitted from the sample 203; a secondary electron detector 212 having a function to convert secondary electrons into an electrical signal; a photomultiplier tube 213 for amplifying the intensity of a detected electrical signal to a desired level; and an A/D converter 214 for converting the amplified electrical signal into a digital signal. It should be noted that the above components 204 and 206 to 213 are controlled by a controller 215.

On the other hand, the information processing system 202, which measures the dimensions of the imaged pattern based on the digitized secondary electron image data, primarily includes: an image generating unit 216 for generating (optical) image data from the secondary electron image data; a dimension measuring unit 217 for calculating a pattern dimension from the image data; a storage unit 218 for storing various data such as image data and dimension measurements; and an input/output unit 219 having a function (GUI function) to receive imaging conditions and parameters for dimension measurement from the user and to output the processing results. These components can exchange data with each other through the data bus, or network, 12. It should be noted that the image generating unit 216 and the dimension measuring unit 217 may be implemented together by a single CPU. Further, the information processing system 202 can exchange data with the other scanning electron microscopes 10 and the tool-to-tool matching control apparatus 11 through the data bus, or network 12.

Figure 3:
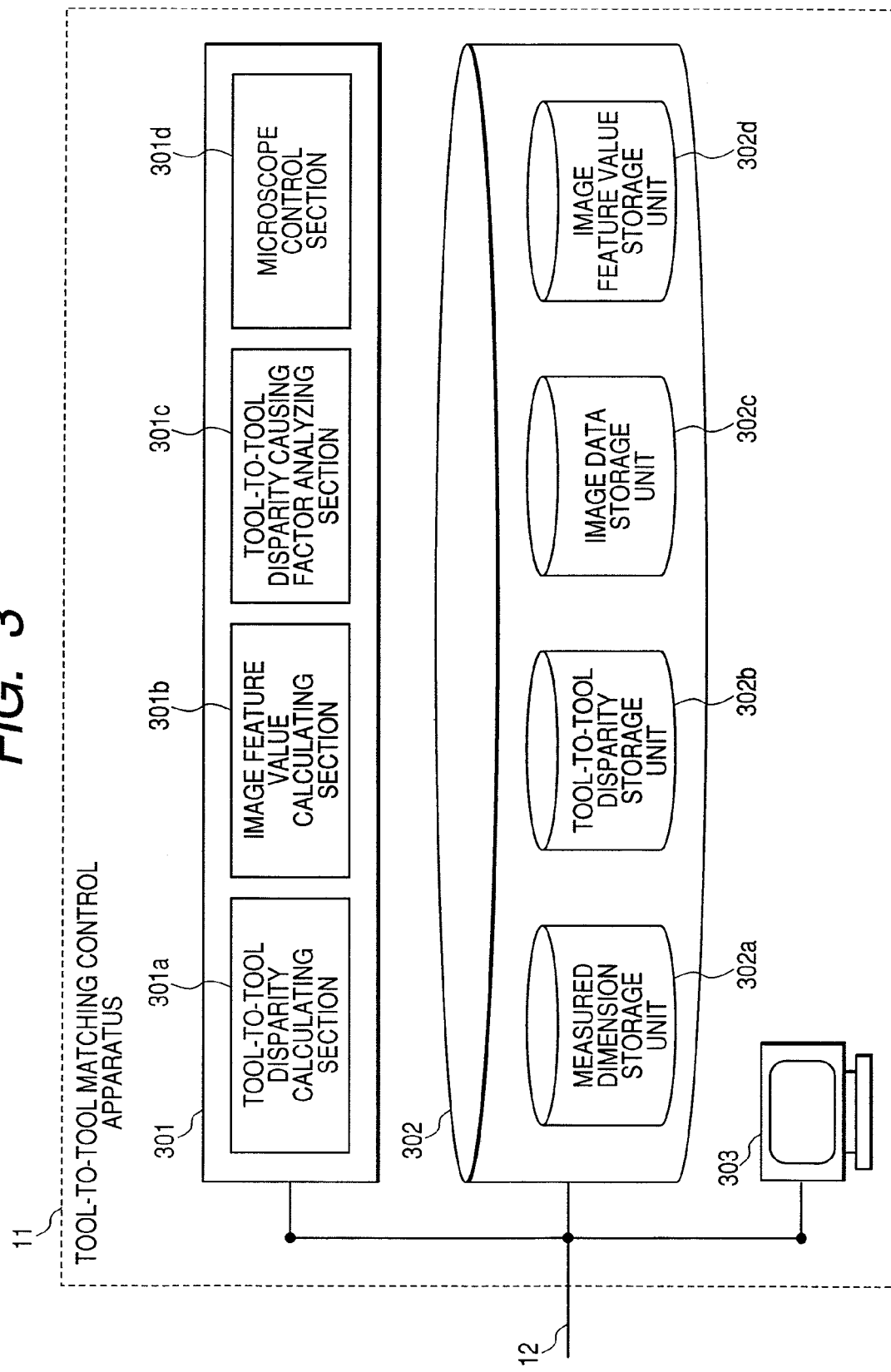
FIG. 3 is a diagram showing an exemplary configuration of the tool-to-tool matching control apparatus shown in FIG. 1.

FIG. 3 shows an exemplary configuration of the tool-to-tool matching control apparatus 11. The tool-to-tool matching control apparatus 11 is made up primarily of a processing unit 301, a storage unit 302, and an input/output unit (or input/output means) 303. The processing unit 301 includes: a tool-to-tool disparity calculating section 301a for calculating a difference or variation in dimension measurements (namely, CD values) obtained by the scanning electron microscopes 10 (that is, a tool-to-tool disparity); an image feature value calculating section 301b for, based on image data captured by the microscopes 10, calculating the values of the indicators, or image features, Ca to Cg, etc. (described later) indicating states of the microscopes 10; a tool-to-tool disparity causing factor analyzing section 301c for comparing and evaluating the dimension values measured by the microscopes 10 and the calculated values of the indicators, or image features, Ca to Cg, etc. indicating the states of the microscopes 10 to identify a factor(s) that has caused the tool-to-tool disparity (such as the tool-to-tool disparity causing factors Fa to Fg); and a microscope control section 301d for changing a device control parameter(s) (such as the device control parameters Pa to Pg, etc.) for each microscope 10 based on the analysis results of tool-to-tool disparity causing factors. It should be noted that the processing unit 301 may be a CPU, and the tool-to-tool disparity calculating section 301a, the image feature value calculating section 301b, the tool-to-tool disparity causing factor analyzing section 301c, and the microscope control section 301d may be programs running on the CPU. The storage unit 302 includes: a measured dimension storage unit 302a for storing the dimension values (or CD values) measured by each microscope 10; a tool-to-tool disparity storage unit 302b for storing tool-to-tool disparities calculated from the dimension values (or CD values); an image data storage unit 302c for storing image data, etc. obtained by each microscope 10; and an image feature value storage unit 302d for storing values of the image features Ca to Cg, etc. calculated from image data.

(2) Method for Evaluating Tool-to-Tool Disparity Causing Factors

Figure 4:
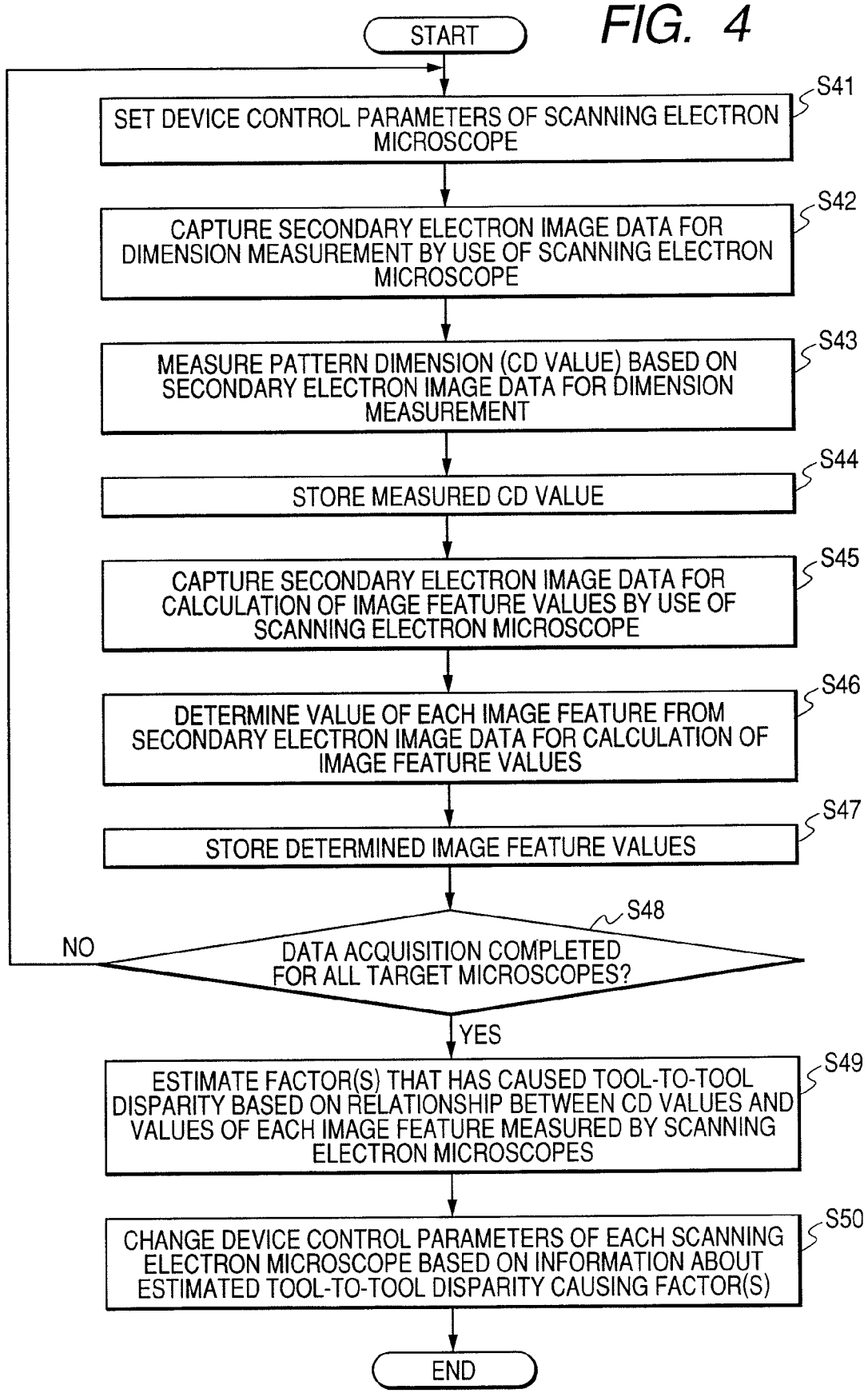
FIG. 4 is a flowchart showing an exemplary entire process sequence for identifying a factor that has caused a tool-to-tool disparity according to the first embodiment of the present invention.

FIG. 4 shows an exemplary entire process sequence for identifying a factor that has caused a tool-to-tool disparity.

Referring to the entire sequence shown in FIG. 4, in order to calculate a tool-to-tool disparity, first a scanning electron microscope 10 (shown in FIG. 2) performs the following sequential steps: the control unit 215 sets device control parameters (step S41); the image generating unit 216 in the information processing system 202 generates secondary electron image data for dimension measurement using a reference wafer for dimension measurement, or a reference wafer for tool-to-tool disparity measurement (step S42); and the dimension measuring unit 217 in the information processing system 202 calculates a dimension (the CD value) of a target pattern based on the secondary electron image data received from the image generating unit 216 (step S43). The pattern dimension value (or CD value) calculated by the microscope 10 is sent to the tool-to-tool matching control apparatus 11 through the data bus (or network) 12 and stored in the measured dimension storage unit 302a of the storage unit 302 in the tool-to-tool matching control apparatus 11 at step S44. Then, the same scanning electron microscope 10, whose device control parameters have been set at step S41 as described above, further performs the following step: the image generating unit 216 in the information processing system 202 generates secondary electron image data for image feature value calculation using a reference wafer for device control (step S45). The generated secondary electron image data is stored, for example, in the image data storage unit 302c of the storage unit 302 in the tool-to-tool matching control apparatus 11. Then, at step S46, based on the generated secondary electron image data, the image feature value calculating section 301b of the processing unit 301 in the tool-to-tool matching control apparatus 11 calculates the values of indicators, or image features, indicating states of the microscope 10, such as the image brightness information Ca (for example, average gray value), image contrast Cb (for example, the difference between the highest and lowest gray values), image noise level Cc, tilt indicator value Cd, the pitch Ce of a repeated pattern, the resolution evaluation indicator value Cf calculated based on the image, and the axial alignment (astigmatic adjustment) indicator value Cg calculated based on the image. The calculated values of these indicators, or image features, are stored in the image feature value storage unit 302d at step S47. It should be noted that all other scanning electron microscopes to be subjected to tool-to-tool matching control also perform the above steps (step S48).

Then, the tool-to-tool disparity calculating section 301a calculates a tool-to-tool disparity from the dimension measurements (namely, CD values) obtained from the microscopes 10 and stored in the measured dimension storage unit 302a, and stores it in the tool-to-tool disparity storage unit 302b. Further, at step S49, the tool-to-tool disparity causing factor analyzing section 301c determines the correlation between the CD values obtained from the microscopes 10 and stored in the tool-to-tool disparity storage unit 302b and the values of indicators, or image features, (indicating states of the microscopes 10) obtained from the microscopes 10 and stored in the image feature value storage unit 302d to estimate a factor(s) (such as Fa to Fg, etc.) that has caused the tool-to-tool disparity. Then, at step S50, the microscope control section 301d instructs the control unit 215 of each microscope 10 to change the device control parameters Pa to Pg, etc. of the microscope according to the estimation results, completing the tool-to-tool matching process.

There will now be described the device control parameters set by the control unit 215 at step S41 of FIG. 4. These device control parameters are used to control the scanning electron microscopes 10 and 18 shown in FIGS. 2 and 8, respectively, and include: a position control parameter for controlling the position of the stage 204; a voltage/current control parameter for causing the electron gun 206 to emit the electron beam 205; an astigmatic adjustment coil control parameter for shaping the electron beam 205; a deflector lens 208 control parameter for setting the amount of deflection, the scan angle, and the scan range of the electron beam; an objective lens 209 control parameter for controlling the focal point of the electron beam; a retarding electrode 210 voltage/current control parameter for adjusting the acceleration voltage of the electron beam near the wafer; a booster 211 voltage/current control parameter for "pulling up" the emitted secondary electrons; a detection sensitivity adjustment parameter for the secondary electron detector 212; a gain adjustment parameter for the photomultiplier tube 213; and a conversion gain/offset adjustment parameter for the A/D converter 214. In addition, the device control parameters set by the control unit 215 further include a vacuum adjustment parameter for the vacuum chamber within the microscope, a temperature/humidity adjustment parameter for the atmosphere around the electron beam path, and a temperature/humidity parameter for the atmosphere around the microscope.

There will now be specifically described step S42 in which each microscope 10 captures secondary electron image data for CD value calculation.

The pattern to be measured on the reference wafer for dimension measurement is preferably configured such that even a slight change in the state of the microscope leads to a significant change in the CD value (obtained by the microscope). Such patterns include those having a sharp edge. Further, the pattern dimensions (critical dimension) preferably do not vary much across the surface of the wafer. The reason for this is that when the CD values measured by microscopes are compared with each other, each CD value should not depend on the position on the pattern where it is measured. Actually, each microscope measures the critical dimension (CD) at a plurality of positions, and the average of these CD values is used as a representative CD value for comparison. If the pattern dimensions (critical dimension) vary widely across the wafer surface, the critical dimension (CD) of the pattern must be measured at a larger number of positions in order to eliminate the dependence of the averaged (or representative) CD value on the position on the pattern and thereby ensure sufficient measurement accuracy.

Figure 5:
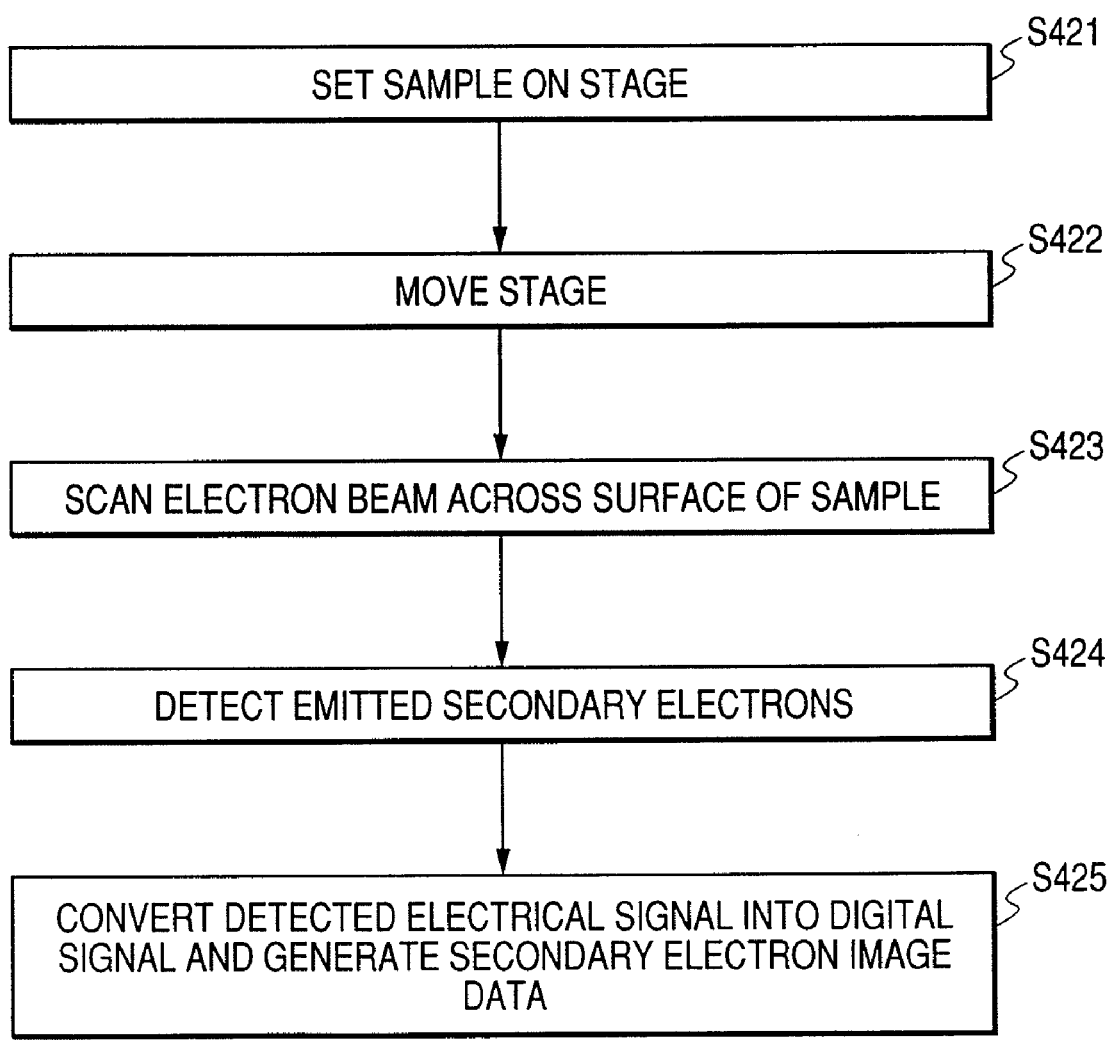
FIG. 5 is a flowchart specifically showing step S42 of FIG. 4, illustrating a sequence for capturing secondary electron image data by use of a reference wafer for dimension measurement.

The secondary electron image data capturing step (S42) using such a reference wafer for dimension measurement will now be specifically described with reference to FIG. 5. First of all, a reference wafer 203 for dimension measurement having a pattern to be measured thereon is placed on the stage 204 at step S421. Then, at step S422, in response to an instruction from the control unit 215, the stage 204 is moved to a position at which an image of the pattern to be measured can be captured through electron beam irradiation. After that, the electron beam 205 is emitted from the electron gun 206, passed through the aperture 207, and deflected by the primary electron beam deflector 208 so as to scan the electron beam across the surface of the sample (or wafer) on the stage at step S423. At that time, the objective lens 209 is controlled so as to capture an focused image, and furthermore the retarding electrode 210 is activated so that the captured image has a high resolution.

Then, the secondary electrons (or signal) emitted from the sample scanned with the electron beam are "pulled up" to the secondary electron detector 212 by the booster 211, so that the detector detects the secondary electrons (or signal) at step S424. At that time, a value set for the objective lens 209 (that is, the objective lens control value when the image was captured) is read from the control unit 215 and stored in the storage unit 218 as the magnification of the captured image. The reason for storing this value is that, since the magnification of the captured image varies slightly depending on the settings of the objective lens 209, this slight change in the magnification must be reflected in the later CD value calculation processing in order to calculate an accurate CD value. Lastly, at step S425, the captured secondary electron signal is amplified by the photomultiplier tube 213 and then converted into a digital signal (digitized secondary electron data) by the A/D converter 214, and then secondary electron image data is generated from the digitized secondary electron data by the image generating unit 216.

The generated secondary electron image data is stored in the storage unit 218 of the scanning electron microscope 10 and in the image data storage unit 302c of the tool-to-tool matching control apparatus 11. All other scanning electron microscopes to be subjected to tool-to-tool matching control also perform the above steps, thus capturing secondary electron image data at a number of locations on the pattern to be measured.

Figure 7A:
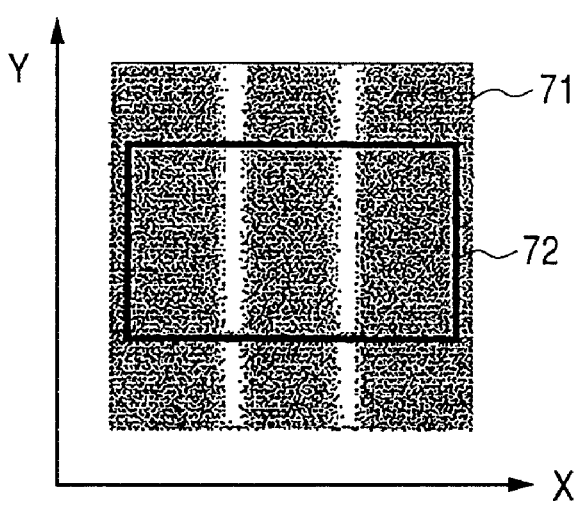
FIG. 7A shows an SEM image of a pattern to be measured.

With reference to FIG. 6, there will now be specifically described step S43 of FIG. 4 in which the dimension measuring unit 217 of each microscope 10 calculates a CD value from secondary electron image data in order to evaluate tool-to-tool disparity causing factors. First, an image profile is produced from secondary electron image data. Specifically, at step S431, an image area 72 for preparing a profile is selected from a captured microscopic image 71 shown in FIG. 7A. The image area 72 must be such that: it contains at least the entire pattern dimension to be measured (hereinafter referred to as "the dimension of the pattern in the X-direction"); and there are as many pixels in the Y-direction (that is, a direction perpendicular to the pattern dimension to be measured) as necessary to calculate an appropriate average pixel value and thereby calculate an accurate dimension value (in the X-direction). Specifically, the image area must includes a few hundreds of pixels in the Y-direction to reduce the noise inherent in scanning electron microscopes. The more pixels used to calculate an average pixel value, the larger the reduction in the noise components inherent in the scanning electron microscope. It should be noted that the dimensions of the image area in the X- and Y-directions may be changed as necessary depending on the shape of the pattern to be measured.

Figure 7B:
FIG. 7B shows the waveform of a signal obtained as a result of scanning the SEM image along a line in the X-direction.
Figure 7C:
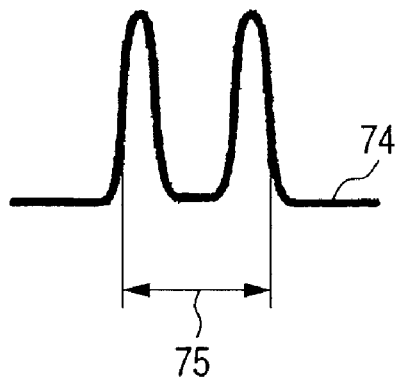
FIG. 7C shows a image profile obtained by smoothing the waveform of the single-line signal.

Then, in the selected image area 72, the values of the pixels in each column in the Y-direction are averaged to produce a single-line waveform 73 as shown in FIG. 7B at step S432. Lastly, at step S434, the single-line waveform is smoothed by a filter having a filter parameter specified at step S433, producing an image profile 74 as shown in FIG. 7C. It should be noted that the above filter processing (step S434) may be omitted.

Then, a CD value is calculated from the generated image profile 74 at step S435. There are various method for calculating the CD value. According to the present embodiment, for example, the distance in the X-direction between the middle points of both slanted outside lines of the image profile is set as the CD value (75), as shown in FIG. 7C.

This completes the detailed description of the step (S43) of calculating a CD value based on secondary electron image data.

Actually, CD values are calculated from the secondary electron image data captured at a number of locations on the pattern at step S42 of FIG. 4, and the average or median of these calculated CD values is set as a representative CD value for the microscope. (The distribution range of the calculated CD values is assumed to constitute the error range.) This process of calculating CD values and averaging them is performed for each scanning electron microscope. Each calculated (representative) CD value is stored in the storage unit 218 of a respective scanning electron microscope 10 and in the measured dimension storage unit 302a of the tool-to-tool matching control apparatus 11.

There will now be specifically described step S45 of FIG. 4 at which each microscope 10 captures secondary electron image data for calculation of values of indicators, or image features, indicating states of the microscope.

An image feature (as used herein) is a feature in an image that reflects a state of the microscope that captured the image. Examples of image features include image brightness information Ca (for example, an average brightness level), image contrast Cb, image noise level Cc, tilt indicator value Cd, the pitch Ce of a repeated pattern, resolution evaluation indicator value Cf calculated based on the image, and axial alignment (astigmatic adjustment) indicator value Cg also calculated based on the image.

Of these image features, the average image brightness level Ca and the image contrast Cb can be determined based on a histogram of gray values in the image, and the image noise level Cc is determined based on the variation in the (light) intensity of a portion of the image having no pattern image. Further, the tilt indicator value Cd can be determined by capturing secondary electron image data of a pyramidal pattern for tilt calculation and analyzing the edge lines of the pyramid. Further, the pitch Ce of a repeated pattern can be measured from secondary electron image data of the repeated pattern. Still further, the resolution evaluation indicator value Cf can be determined by several known methods. For example, the indicator value Cf may be determined by applying DFT (Discrete Fourier Transform) to the image or calculating autocorrelation function (ACF) coefficients. Or it may be determined by measuring the width of convex portions of the image (referred to as the ABW method). Specifically, for example, a method using DFT calculates the shortest period in the original image from the DFT of the image and sets it as the resolution evaluation indicator value. Further, the astigmatic adjustment indicator value Cg can be determined by calculating resolution evaluation indicator values in a plurality of directions and thereby obtaining the distortion of the shape of the beam in each direction. The values of each indicator obtained by the microscopes are compared with each other to identify a factor(s) that has caused the tool-to-tool disparity. Such a factor(s) may be the image brightness difference Fa, image contrast difference Fb, image noise level difference Fc, relative tilt angle Fd, image magnification difference Fe, resolution difference Ff, or axial alignment (astigmatic adjustment) accuracy difference Fg. The calculated values of the image features are stored in the image feature value storage unit 302d of the tool-to-tool matching control apparatus 11.

In order to calculate the values of these image features, the reference wafer for device (microscope) control has thereon a pyramidal pattern for tilt evaluation, a repeated pattern for pattern pitch measurement, and a dense pattern having edges in all radial directions for calculation of resolution evaluation indicator values and an astigmatic adjustment indicator value, in addition to line, hole, and dot patterns. It should be noted that it is possible to use only a single reference wafer having the functions of both the reference wafer for device control and the reference wafer for dimension measurement.

Secondary electron image data of the above reference wafer for device control is captured in the same manner as described with reference to FIG. 5. The values of each image feature obtained by microscopes preferably do not have any dependence on the position on the pattern where they are measured so that they can be properly compared with each other, as in the case of calculation of CD values. Therefore, actually, each microscope measures the same image feature at a number of positions on the pattern using many captured secondary electron images, and the average of the measured values of each image feature is used as a representative value of the feature for the microscope. The captured secondary electron image data is stored in the storage unit 218 of the scanning electron microscope 10 and in the image data storage unit 302c of the tool-to-tool matching control apparatus 11.

There will now be specifically described step S46 of FIG. 4 at which the image feature value calculating section 301b of the tool-to-tool matching control apparatus 11 calculates values of various image features. As in the case of calculation of CD values, the image feature value calculating section 301b reads the secondary electron image data (captured at a number of locations on the pattern by each microscope) from the image data storage unit 302c, calculates values of each image feature from the image data, and sets the average or median of these values as a representative value of the feature for the microscope. (The distribution range of the calculated values is assumed to constitute the error range.) Thus, the image feature value calculating section 301b calculates a representative value of each image feature (Ca to Cg, etc.) for each microscope. Examples of how to determine the value of each image feature (Ca to Cg, etc.) were described above. The calculated (representative) value of each image feature (Ca to Cg, etc.) is stored in the storage unit 218 of the scanning electron microscope 10 and in the image feature value storage unit 302d of the tool-to-tool matching control apparatus 11.

The tool-to-tool disparity causing factor analyzing section 301c determines the correlation between the dimension values (or CD values) obtained from the microscopes 10 and stored in the tool-to-tool disparity storage unit 302b and the values of each indicator, or image feature, Ca to Cg, etc. (indicating a state of each microscope 10) obtained from the microscopes 10 and stored in the image feature value storage unit 302d, and thereby estimates a factor that has caused the tool-to-tool disparity. Such a factor(s) may be the image brightness difference Fa, image contrast difference Fb, image noise level difference Fc, relative tilt angle Fd, image magnification difference Fe, resolution difference Ff, or the axial alignment accuracy difference Fg.

There will now be specifically described step S49 of FIG. 4 at which the tool-to-tool-variation causing factor analyzing section 301c of the tool-to-tool matching control apparatus 11 estimates a factor(s) that has caused the tool-to-tool disparity. First, the tool-to-tool disparity causing factor analyzing section 301c determines the correlation between the CD values obtained from the microscopes 10 and stored in the measured dimension storage unit 302a and the values of each image feature calculated at step S46 of FIG. 4 and stored in the image feature value storage unit 302d. If these CD values and values of an image feature have a higher correlation than a predetermined threshold value, the tool-to-tool disparity causing factor analyzing section 301c determines that the tool-to-tool disparity causing factor (Fa to Fg, or etc.) indicated by this image feature has caused the tool-to-tool disparity. It should be noted that principal component analysis or other technique for evaluating the dependence of CD values on an image feature may be used instead of correlation evaluation between CD values and an image feature.

There will now be specifically described step S50 of FIG. 4 at which the microscope control unit 301d instructs each microscope 10 to change its device control parameters. If the CD values have a high correlation with one of the indicators, or image features, Ca to Cg, etc. (indicating states of the microscopes), the device control parameter (Pa to Pg, or etc.) corresponding to the tool-to-tool disparity causing factor (Fa to Fg, or etc.) indicated by the correlated indicator is adjusted. The corresponding relationship between the tool-to-tool disparity causing factors (Fa to Fg) and the device control parameters (Pa to Pg) to be adjusted is as follows: the image brightness (or average brightness level) difference Fa and the image contrast difference Fb (that is, the difference in the (macroscopic) brightness level distribution) can be adjusted by changing the photomultiplier gain Pa or the probe current (or electron beam current) Pb; the image noise level difference Fc, the probe current (or electron beam current) Pc; the relative tilt angle Fd, the beam tilt control value of the deflection coil or the stage installation angle, Pd; the image magnification difference Fe, the deflection coil magnification control value Pe; the resolution difference Ff, the objective lens control value, retarding control value, or the aperture (changed by replacing the mechanism) Pf; and the astigmatic adjustment accuracy difference Fg, the axial alignment coil (astigmatic adjustment coil) control value Pg.

The required amount of adjustment of each device control parameter (Pa to Pg, etc.) may be determined as follows. (1) When a device control parameter needs to be adjusted, the required amount of adjustment is determined so as to minimize the value of the corresponding image feature or the tool-to-tool disparity. Alternatively, (2) the relationship between the amount of adjustment of each device control parameter (Pa to Pg, etc.) and is the amount of change in the value of each image feature (Ca to Cg, etc.) is found beforehand, and the required amount of adjustment of each device control parameter is determined based on this relationship.

Information about the required amount of adjustment of each device control parameter (Pa to Pg, etc.) is sent from the microscope control section 301d of the tool-to-tool matching control apparatus 11 to the control unit 215 of a respective microscope which then adjusts its device control parameters according to this information.

There will now be described exemplary input/output screens displayed by the input/output unit 219 of the information processing system 202 in each microscope and by the input/output unit 303 of the tool-to-tool matching control apparatus 11.

Figure 9:
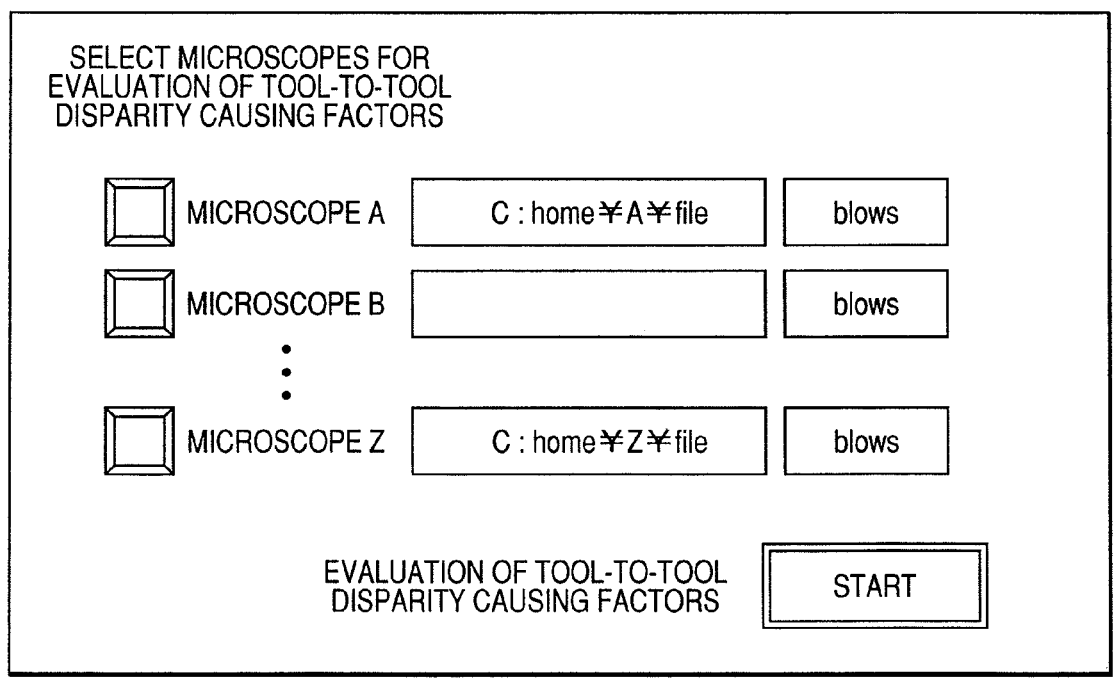
FIG. 9 is a diagram showing an exemplary screen with exemplary icons (or buttons) thereon displayed by the input/output unit of a tool-to-tool matching control apparatus of the present invention before evaluation of tool-to-tool disparity causing factors, wherein: the screen is used to specify a scanning electron microscope(s) and data (device control parameter data, etc.) for evaluation of tool-to-tool disparity causing factors; and the button is pressed by the user to start the evaluation.

FIG. 8 shows an exemplary icon (or button) displayed by the input/output unit 219 of each scanning electron microscope 10, wherein the button is pressed by the user to obtain data for evaluation of tool-to-tool disparity causing factors. FIG. 9 shows an exemplary screen with an exemplary icon (or button) thereon displayed by the input/output unit 303 of the tool-to-tool matching control apparatus 11 before evaluation of tool-to-tool disparity causing factors, wherein: the screen is used to specify a scanning electron microscope(s) and data (device control parameter data of the microscope(s), etc.) for evaluation of tool-to-tool disparity causing factors; and the button is pressed by the user to start the evaluation.

Figure 10:
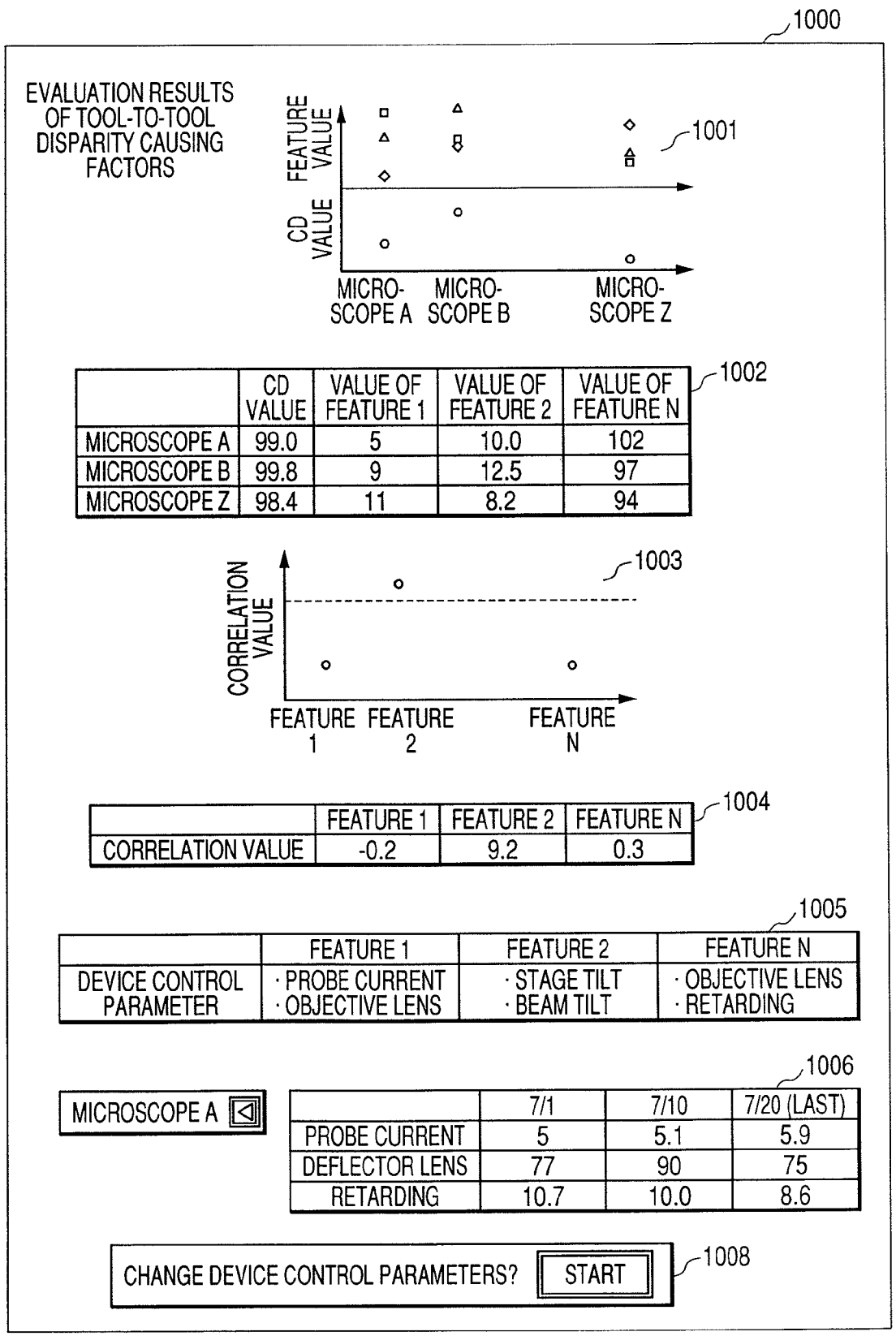
FIG. 10 is a diagram showing an exemplary output screen and exemplary input/output screens displayed by the tool-to-tool matching control system including scanning electron microscopes according to the first embodiment of the present invention, wherein: the output screen shows evaluation results of tool-to-tool disparity causing factors; and the input/output screens are used to automatically adjust the scanning electron microscopes based on information about candidate tool-to-tool disparity factors so as to reduce the tool-to-tool disparity.

FIG. 10 includes exemplary output screens (1000) displayed by this system, showing evaluation results of tool-to-tool disparity causing factors (produced by the tool-to-tool-disparity causing factor analyzing section 301c). Referring to the figure, reference numeral 1001 denotes a graph showing the relationship between dimension values or CD values (indicated by a circle) measured by microscopes A to Z and the values of an image feature 1 (indicated by a rhombus), values of an image feature 2 (indicated by a triangle), . . . , and values of an image feature N (indicated by a square) in images captured by these microscopes A to Z. It should be noted that this graph is also considered to indicate differences (or the tool-to-tool disparities) between a CD value measured by a reference microscope and CD values measured by the microscopes A to Z and the differences between the values of these image futures 1 to N in an image captured by the reference microscope and the values of the image futures 1 to N in images captured by microscopes A to Z. Further, reference numeral 1002 denotes a table showing the same relationship as graph 1001. Further, reference numeral 1003 denotes a graph showing the correlation values of the image features 1 to N with the dimension values (or CD values) measured by the microscopes A to Z. (The differences between these CD values constitute tool-to-tool disparities between the microscopes A to Z.) It should be noted that this graph is also considered to indicate the correlation values of the image features 1 to N with the differences (or tool-to-tool disparities) between a CD value measured by a reference microscope and CD values measured by the microscopes A to Z. Further, reference numeral 1004 denotes a table showing the same relationship as graph 1003. As shown in graph 1003 and table 1004, among these image features, the image feature 2 has the highest correlation with the tool-to-tool disparity or CD values (indicated by a circle). Therefore, the factor indicated by the image feature 2 is determined to have caused the tool-to-tool disparity. In this way, each (candidate) tool-to-tool disparity causing factor can be examined.

Further, FIG. 10 also includes exemplary input/output screens for automatically adjusting the scanning electron microscopes based on information about (candidate) tool-to-tool disparity causing factors so as to reduce the tool-to-tool disparity. Referring to the figure, reference numeral 1005 denotes a table showing the relationship between the image features 1 to N and the candidate device control parameters (Pa to Pg, etc.) that may be adjusted when the factors (Fa to Fg, etc.) indicated by these image features 1 to N have caused a tool-to-tool disparity. This relationship is stored in the storage unit 302 by the microscope control section 301d as a database beforehand. Further, reference numeral 1006 denotes a table showing, for example, changes in (or histories of) the values of some device control parameters of the microscope A. Further, reference numeral 1008 denotes an icon (or button) for changing device control parameters. This button may or may not be selected depending on the output results. Thus, the input/output unit (input/output means) 303 displays the above input/output screens (1000), and the microscope control section 301d can select an appropriate device control parameter(s) for a factor that has caused the tool-to-tool disparity and adjust the selected device control parameter by an appropriate amount to eliminate the factor so as to correct or reduce the tool-to-tool disparity.

That is, the storage unit 302 stores a database storing the relationship between tool-to-tool disparity causing factors (Fa to Fg, etc.) and device control parameters (Pa to Pg, etc.) for adjusting these tool-to-tool disparity causing factors, and based on this relationship, the microscope control section 301d selects an appropriate device control parameter(s) for the tool-to-tool disparity causing factor displayed and output by the input/output unit 303 and instructs the control unit 215 of each microscope to automatically adjust the selected device control parameter(s) for the microscope by an appropriate amount to reduce the tool-to-tool disparity between the microscopes.

According to the present embodiment described above, it is possible to correct or reduce tool-to-tool disparities between scanning electron microscopes.

Example 2

Figure 11:
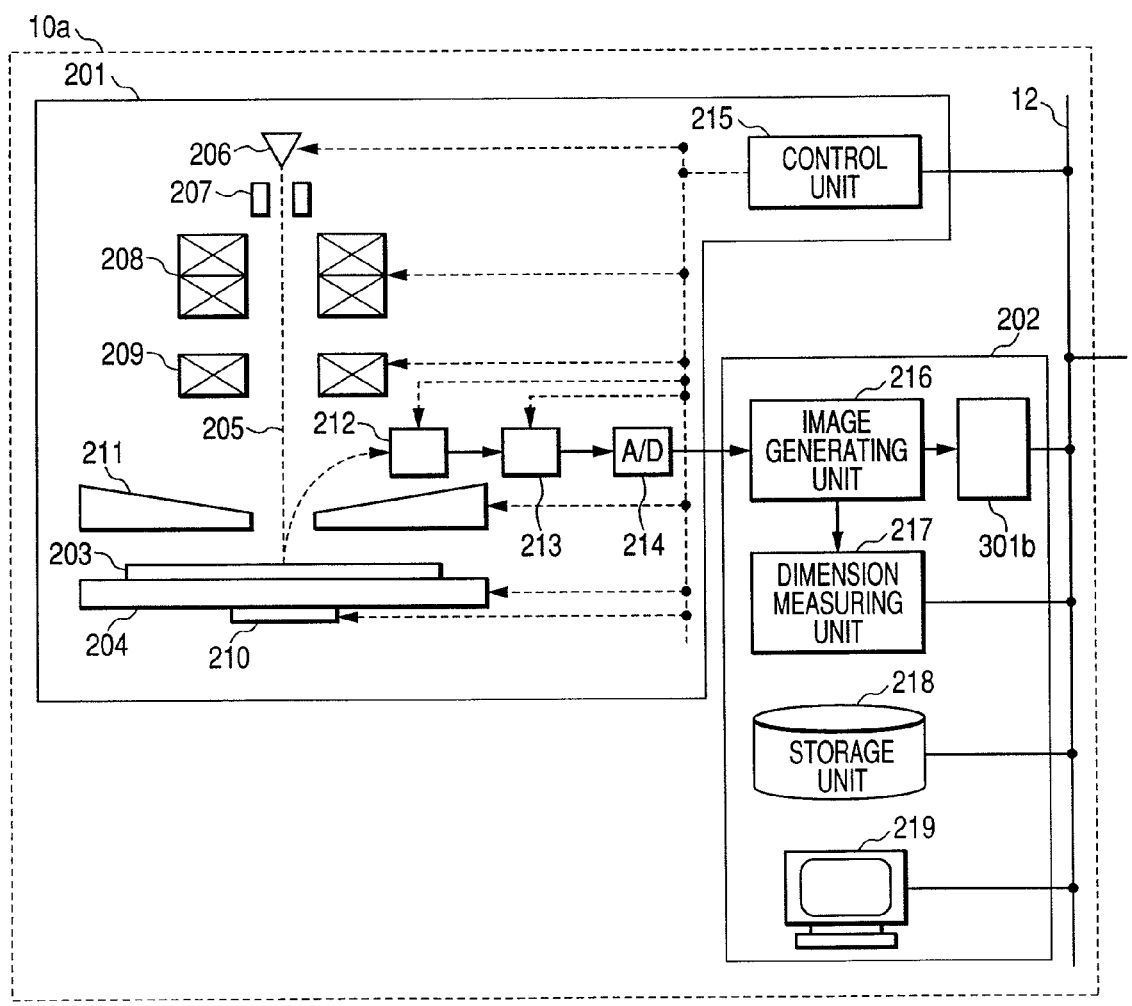
FIG. 11 is a diagram showing the configuration of a second exemplary tool-to-tool matching control system including scanning electron microscopes according to the first embodiment of the present invention.

A second exemplary tool-to-tool matching control system of the present invention (according to the first embodiment) will now be described. This tool-to-tool matching control system is different from that of Example 1 in that, instead of the tool-to-tool matching control apparatus 11, the information processing system 202 in each scanning electron microscope 10a includes an image feature value calculating section 301b, as shown in FIG. 11.

Therefore, in each scanning electron microscope 10a, the image feature value calculating section 301b reads secondary electron image data from the storage unit 218 and calculates the value of each image feature in the secondary electron image data. The calculated value of each image feature is sent to a tool-to-tool matching control apparatus 15 through the data bus, or network, 12 and stored in the image feature value storage unit 302d of the tool-to-tool matching control apparatus 15.

This example allows scanning electron microscopes to correct or reduce tool-to-tool disparities between them.

Example 3

Figure 12:
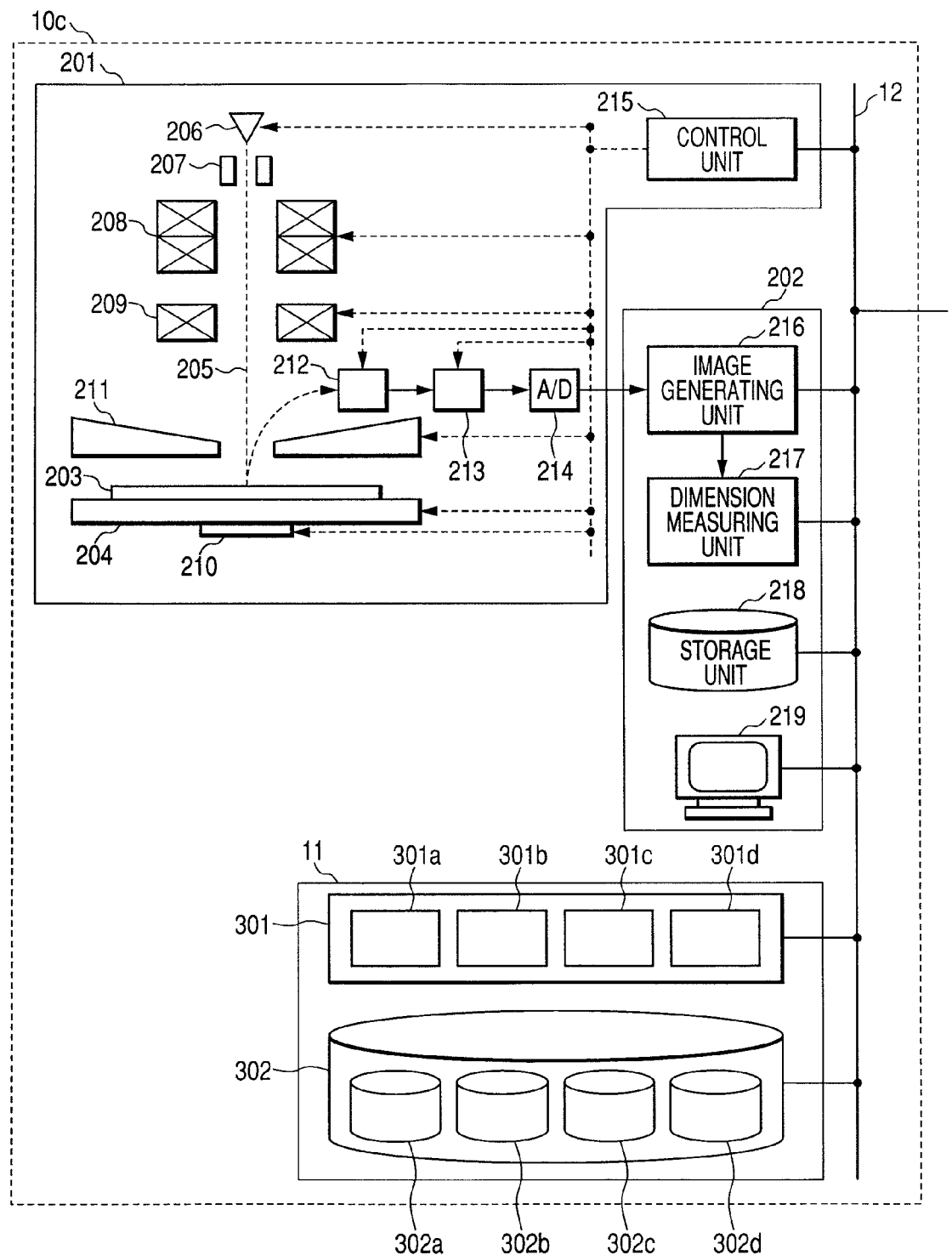
FIG. 12 is a diagram showing the configuration of a third exemplary tool-to-tool matching control system including scanning electron microscopes according to the first embodiment of the present invention.

A third exemplary tool-to-tool matching control system of the present invention (according to the first embodiment) will now be described. This tool-to-tool matching control system is different from those of Examples 1 and 2 in that this system does not include a separate tool-to-tool matching control apparatus 11 such as that of Examples 1 and 2, but the scanning electron microscopes 10c each includes a tool-to-tool matching control apparatus 11 instead, as shown in FIG. 12. (These tool-to-tool matching control apparatuses 11 are connected to each other through the data bus, or network, 12.) As a result, according to Example 3, each scanning electron microscope 10c is made up primarily of: an electron optical system 201 for capturing an electron beam image; an information processing system 202 for processing the captured image to measure the dimensions of a target pattern in the image; and a tool-to-tool-disparity causing factor evaluating unit 11 for controlling and correcting tool-to-tool disparities.

Figure 13:
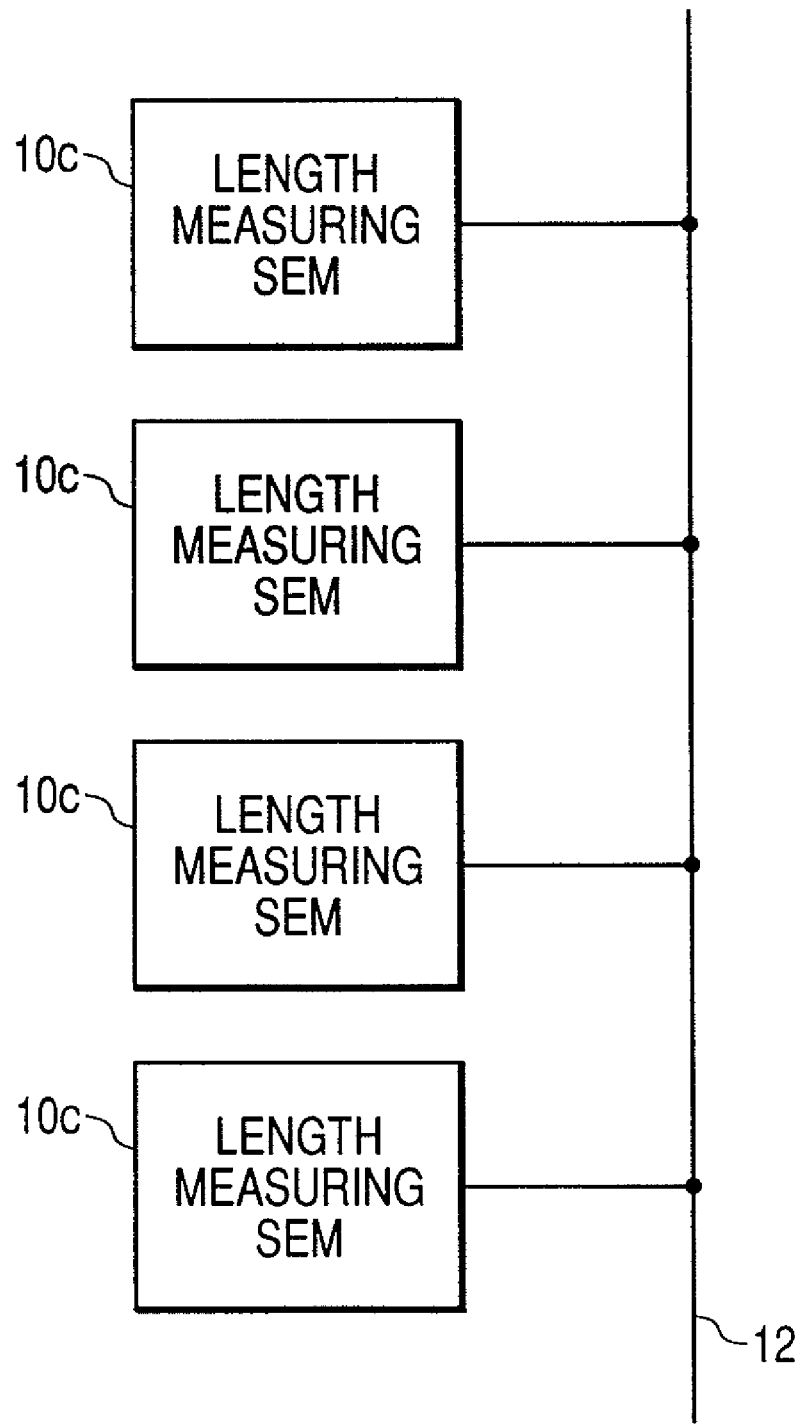
FIG. 13 is a diagram schematically showing the configuration of the scanning electron microscope system shown in FIG. 12.

Thus, the scanning electron microscope system of Example 3 includes a plurality of scanning electron microscopes each having a tool-to-tool disparity correcting function that are connected to each other through the data bus, or network, 12, as shown in FIG. 13.

This example also allows scanning electron microscopes to correct or reduce tool-to-tool disparities between them.

Example 4

Figure 14:
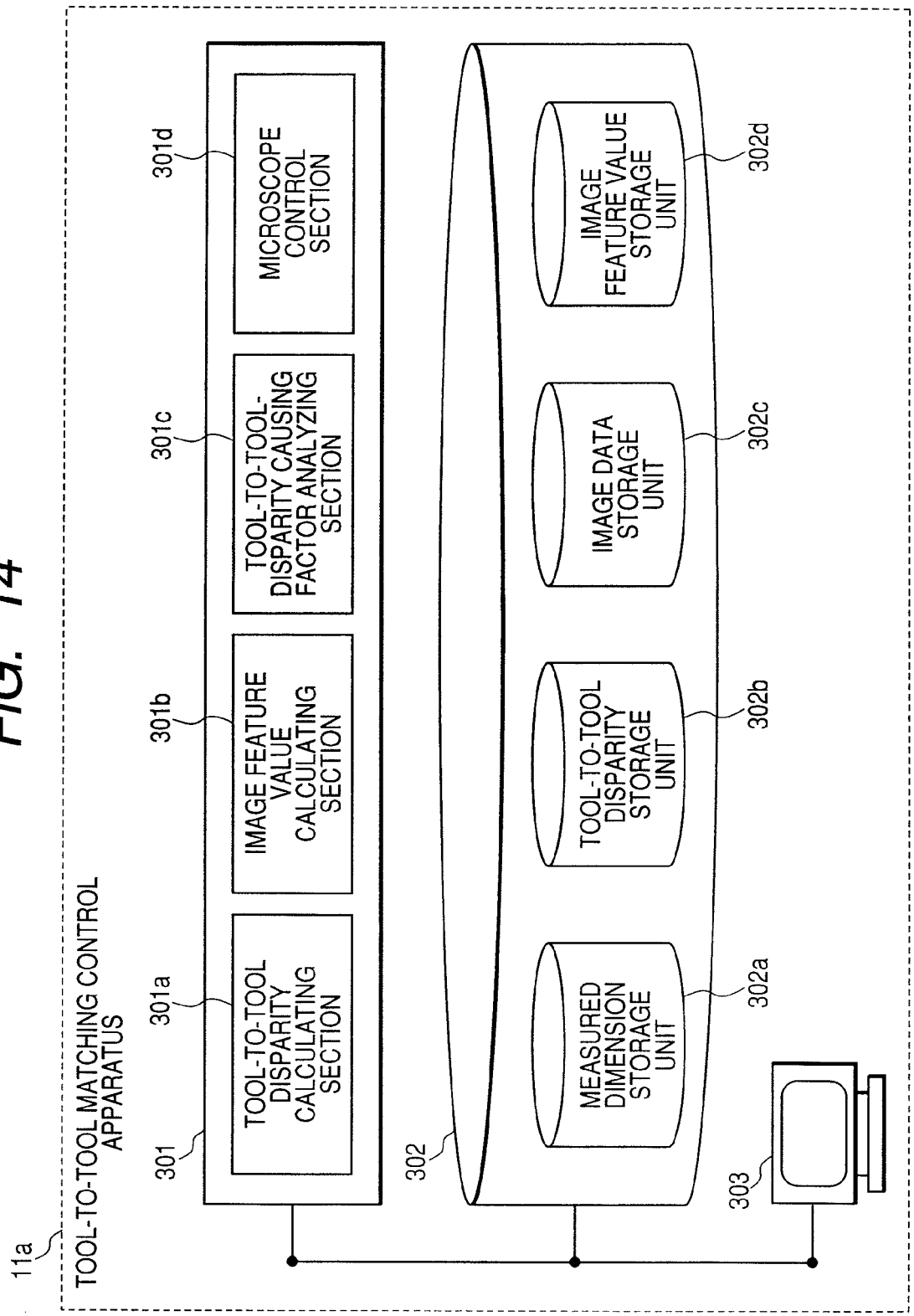
FIG. 14 is a diagram showing the configuration of a fourth exemplary tool-to-tool matching control system according to the first embodiment of the present invention.

A fourth exemplary tool-to-tool matching control system of the present invention (according to the first embodiment) will now be described. This tool-to-tool matching control system is different from those of Examples 1 to 3 in that the tool-to-tool matching control apparatus (11a) described in connection with Example 1 is not connected to the scanning electron microscopes, as shown in FIG. 14.

However, according to Example 4, secondary electron image data and CD values can be supplied from each microscope to the tool-to-tool matching control apparatus 11a through its input/output unit 303, and the processing unit 301 and the storage unit 302 in the tool-to-tool matching control apparatus 11a allow outputting an instruction to change a device control parameter(s) to a new value through the input/output unit 303. The processing within the tool-to-tool matching control apparatus 11a is the same as described in connection with Example 1.

Figure 15:
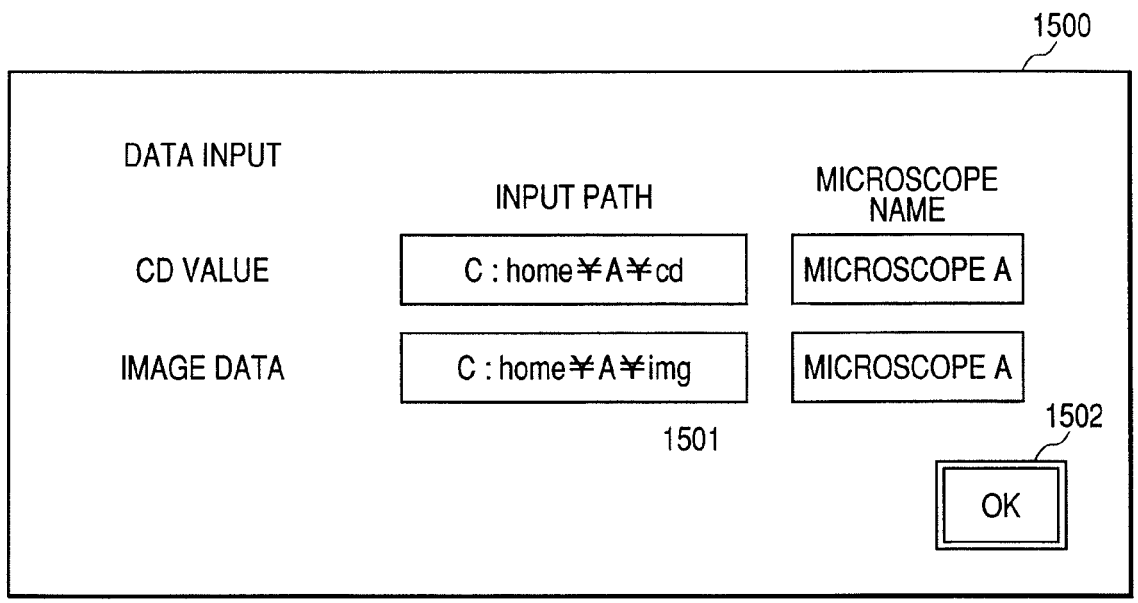
FIG. 15 is a diagram showing an exemplary input screen used by the tool-to-tool matching control system shown in FIG. 14.

FIGS. 9 and 15 show exemplary input screens used by the tool-to-tool matching control system of Example 4. Specifically, FIG. 15 shows an exemplary input screen 1500 used when entering dimension values (or CD values) and secondary electron image data of a target pattern obtained by a plurality of scanning electron microscopes. This screen is used to specify the data storage method, or data storage locations, and includes an input portion (or button) 1502 for entering the input data paths (1501) and information on the input data. FIG. 9 shows an exemplary screen with an exemplary icon (or button) thereon, wherein: the screen is used to specify a scanning electron microscope(s) and data for evaluation of tool-to-tool disparity causing factors; and the button is pressed by the user to start the evaluation.

This example also allows scanning electron microscopes to correct or reduce tool-to-tool disparities between them based on information on toll-to-tool disparity causing factors.

Second Embodiment

It is not easy to pinpoint a factor that has caused a variation in dimension measurements between measuring scanning electron microscopes, since they have a sophisticated configuration.

A second embodiment of the present invention has been devised to address this problem. The second embodiment is different from the first embodiment in that instead of using features in images captured by each scanning electron microscope, the second embodiment uses various device state parameters of each microscope to evaluate tool-to-tool disparity causing factors. Such device (or microscope) state parameters include actual control parameters, environmental indicators (such as the vacuum of the sample chamber), etc.

That is, a tool-to-tool matching control system of the present embodiment automatically monitors various device state parameters of each microscope, such as actual control parameters and environmental indicators (the vacuum of the sample chamber, etc.), in order to evaluate tool-to-tool disparity causing factors. The dimension values measured by the microscopes are compared with the monitored values of each device state parameter to evaluate tool-to-tool disparity causing factors and thereby identify a factor(s) that has caused the tool-to-tool disparity and automatically calibrate each microscope according to the evaluation results. For example, when calculating a tool-to-tool disparity between microscopes, the values of each device state parameter exhibited by the microscopes are measured, and the correlation between these values and the CD values measured by the microscopes is determined. Change in the device state parameter(s) having high correlation with the CD values is considered to be a factor that has caused the tool-to-tool disparity. Therefore, the tool-to-tool disparity can be reduced by adjusting this device state parameter. The actual control parameters of each microscope described above are considered to vary due to component variation or age. Therefore, it is important to examine these control parameters of each microscope. (Changing the value of the same control parameter of each microscope by an equal amount may not lead to a desired result.)

Example 5

Figure 16:
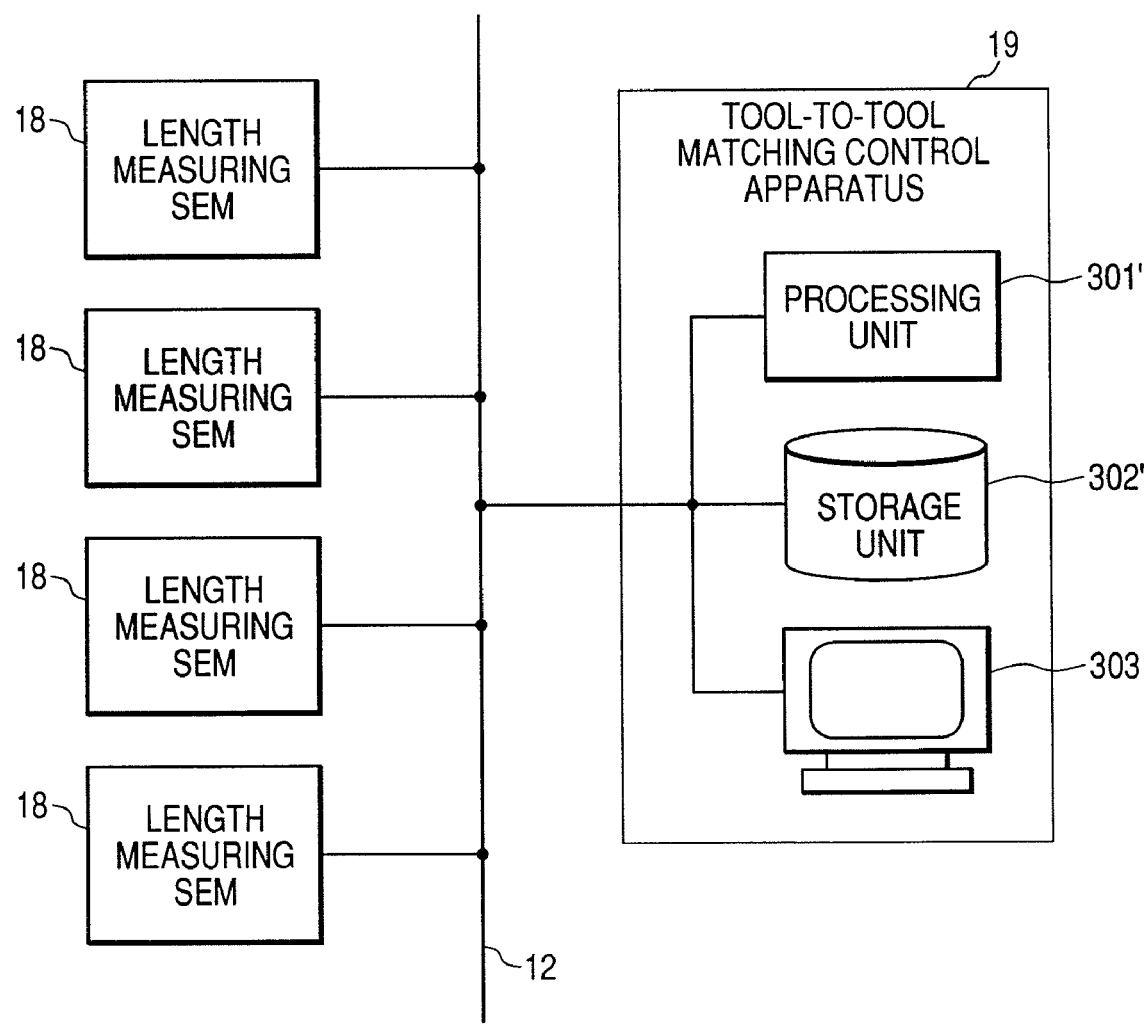
FIG. 16 is a diagram showing the configuration of a fifth exemplary tool-to-tool matching control system including scanning electron microscopes according to a second embodiment of the present invention.

There will now be described a fifth exemplary tool-to-tool matching control system including scanning electron microscopes according to the second embodiment, capable of calibrating these microscopes so as to reduce tool-to-tool disparities between them.
(1) System Configuration FIG. 16 shows the configuration of a fifth exemplary tool-to-tool matching control system including scanning electron microscopes according to the present invention. This system is made up primarily of a plurality of scanning electron microscopes 18 (length measuring SEMs or CDSEMs) and a tool-to-tool matching control apparatus 19 for controlling tool-to-tool disparities between these microscopes. The microscopes 18 and the tool-to-tool matching control apparatus 19 are connected to each other through a data bus, or network, 12.

Figure 17:
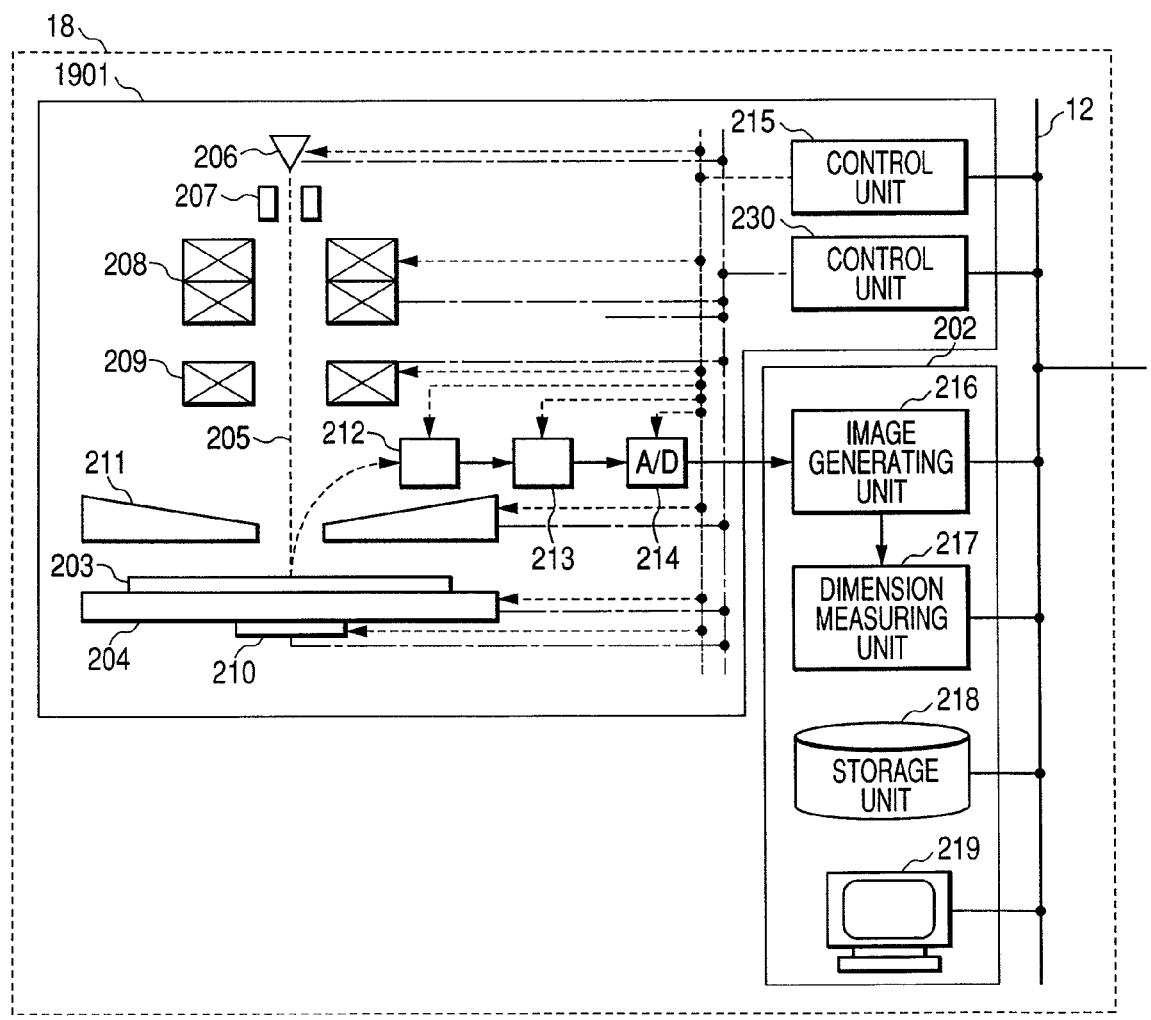
FIG. 17 is a diagram showing an exemplary configuration of the individual scanning electron microscopes shown in FIG. 16.

FIG. 17 shows an exemplary configuration of the individual scanning electron microscopes 18. Each scanning electron microscope 18 is made up of two major portions: an electron optical system 1901 for capturing an electron beam image; and an information processing system 202 for processing the captured image to measure a target pattern in the image.

The electron optical system 1901 is different from the electron optical system 201 shown in FIG. 2 in that it includes a measuring unit 230 for measuring or monitoring various device state parameters (corresponding to input device control parameters) of the components in each microscope, such as the electron gun voltage/current A, deflector lens current B, objective lens current C, retarding current/voltage D, booster current/voltage E, input/output values F of the secondary electron detector, and input/output values G of the photomultiplier tube, and various environmental indicators (described below). Examples of environmental indicators include, for example, the temperature, humidity, degree of vacuum, electric field, magnetic field, and variation at each location in the microscope, the operating time of the microscope, and the charge state of the sample.

The configuration of the information processing system 202, on the other hand, is the same as that shown in FIG. 2. It should be noted that the storage unit 218 stores the values of various device state parameters measured by the measuring unit 230 when tool-to-tool disparity causing factors are evaluated. Further, the information processing system 202 can exchange data with other scanning electron microscopes 18 and the tool-to-tool matching control apparatus 19 through a data bus, or network, 12.

Figure 18:
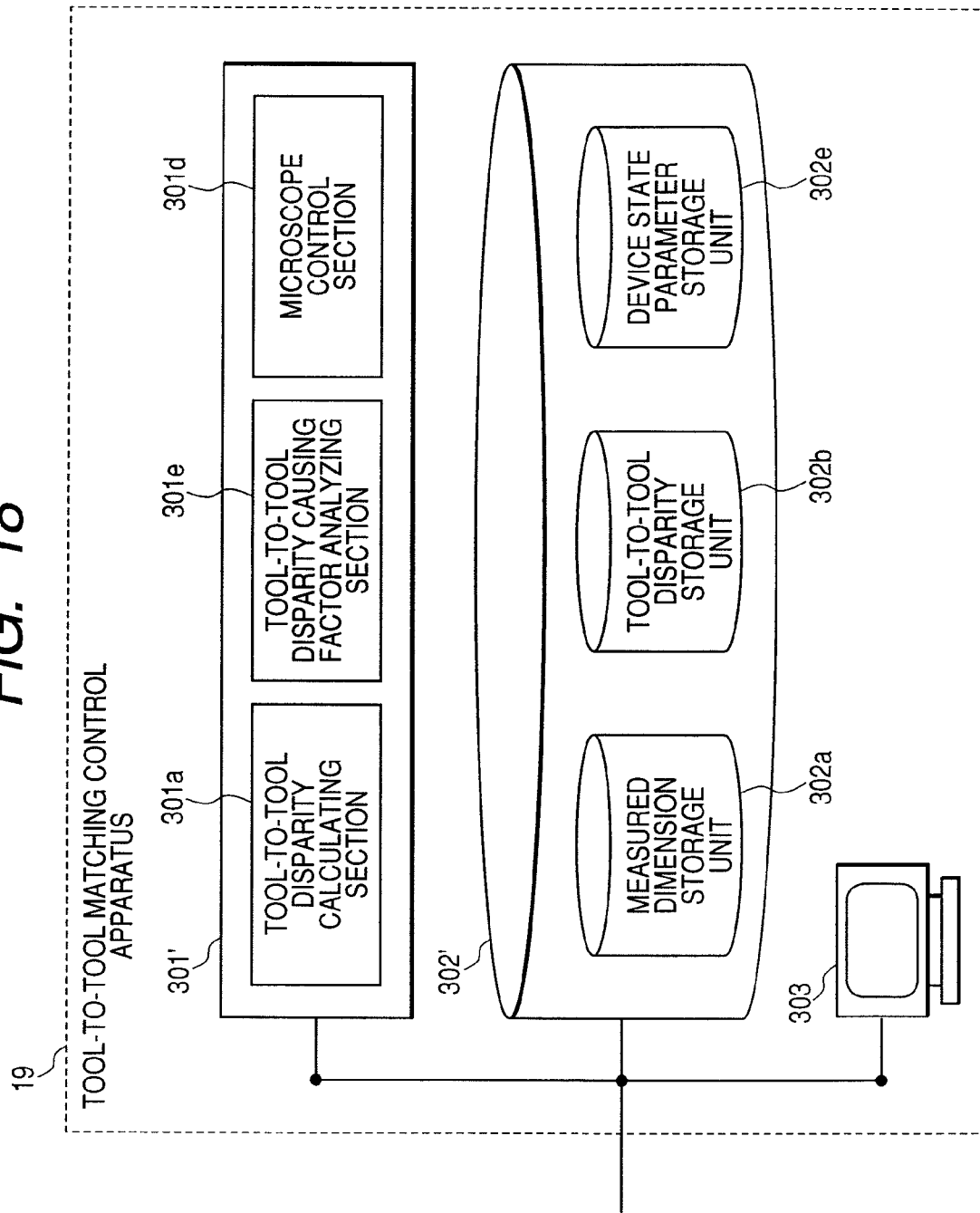
FIG. 18 is a diagram showing an exemplary configuration of the tool-to-tool matching control apparatus shown in FIG. 16.

Further, for example, the tool-to-tool matching control apparatus 19 is made up primarily of a processing unit 301', a storage unit 302, and an input/output unit 303, as shown in FIG. 18. The processing unit 301' includes: a tool-to-tool disparity calculating section 301a for calculating a difference or variation in dimension measurements (namely, CD values) obtained by the scanning microscopes 18 (that is, a tool-to-tool disparity); a tool-to-tool-disparity causing factor analyzing section 301e for comparing and evaluating the dimension values (or CD values) measured by the microscopes 18 and the values of various device state parameters exhibited by the microscopes 18 to identify a factor that has caused the tool-to-tool disparity; and a microscope control section 301d for changing device control parameters of each microscope 18 based on the analysis results of tool-to-tool disparity causing factors. The storage unit 302' includes: a measured dimension storage unit 302a for storing the dimension values (or CD values) measured by the microscopes 18; a tool-to-tool disparity storage unit 302b for storing tool-to-tool disparities calculated from the dimension values; and a device state parameter storage unit 302e for storing values of various device state parameters.

(2) Method for Evaluating Tool-to-Tool Disparity Causing Factors

Figure 19:
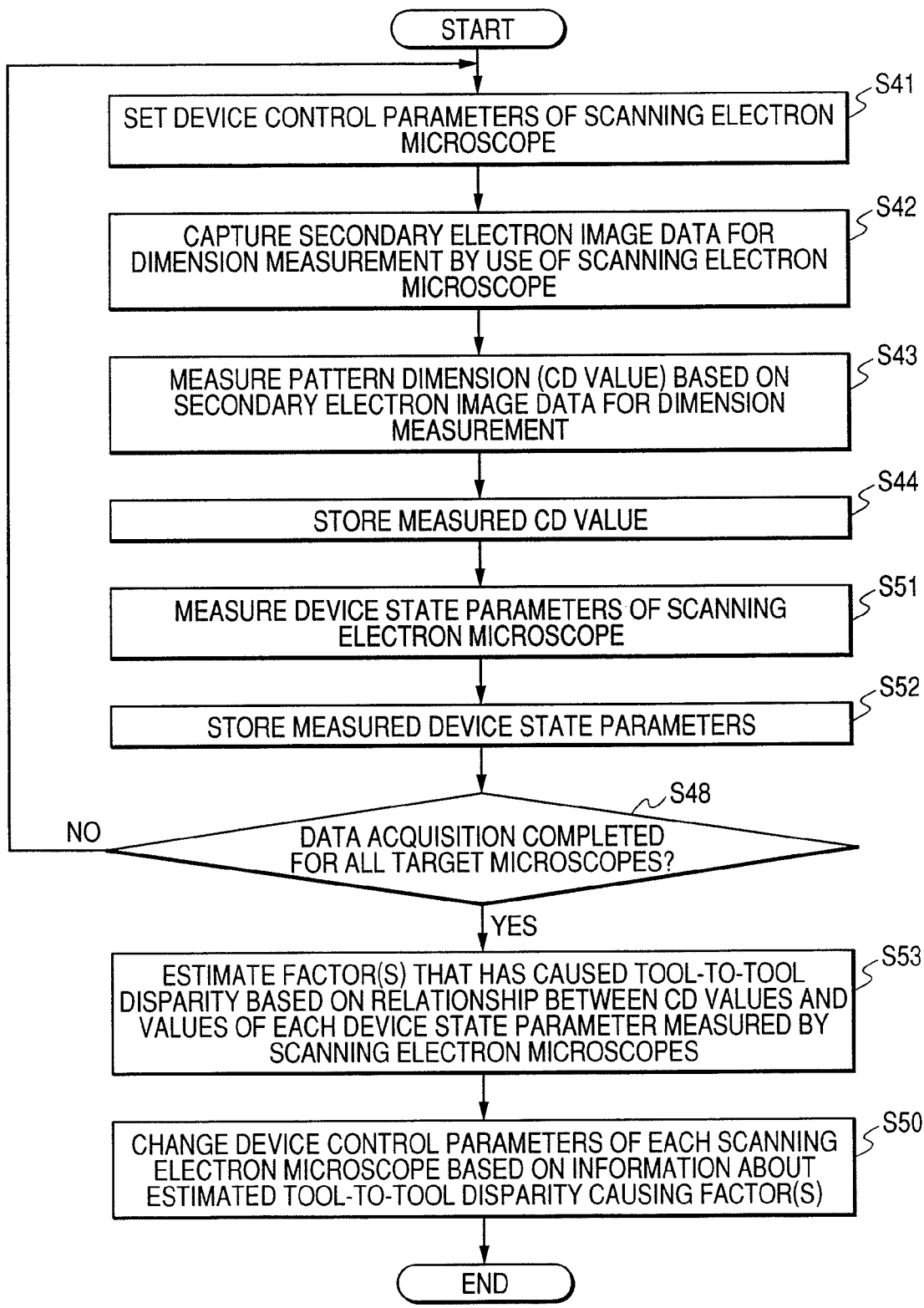
FIG. 19 is a flowchart showing an exemplary entire process sequence for identifying a factor that has caused a tool-to-tool disparity according to the second embodiment of the present invention.

FIG. 19 shows an exemplary entire process sequence for identifying a factor(s) that has caused a tool-to-tool disparity.

This process sequence is different from that shown in FIG. 4 in that it includes the following steps: the measuring unit 230 of each scanning electron microscope 18 measures the value of each device state parameter exhibited by the microscope when a CD value of the pattern to be measured is calculated (step S51); the storage unit 218 of each microscope 18 and the device state parameter storage unit 302e store the measured values of the device state parameters (step S52); and the tool-to-tool disparity causing factor analyzing section 301e estimates a factor(s) that has caused the tool-to-tool disparity based on the relationship between the CD values measured by the microscopes 18 and the values of each device state parameter exhibited by these microscopes (step S53). In this process sequence, after step S53, at step S50 the microscope control section 301d instructs the control unit 215 of each microscope 18 to change device control parameters for the microscope according to the estimation results, completing the tool-to-tool maching process. It should be noted that steps S41 to S44, S48, and S50 in the sequence of FIG. 19 are the same as those described with reference with FIG. 4. It should be further noted that the device control parameters set for each microscope at step S41 are the same as described above.

There will now be specifically described various device state parameters measured at step 51 of FIG. 19. Examples of device state parameters measured by the measuring unit 230 in each scanning electron microscope 18 include: parameters that affect the state of the electron beam, such as the electron gun voltage/current A, deflection lens current B, objective lens current C, retarding current/voltage D, and booster current/voltage E; parameters that affect the state of the secondary electrons emitted from the target pattern, such as the input/output values F of the secondary electron detector and input/output values G of the photomultiplier tube; and parameters that may cause an error in the captured secondary electron image data, such as the stage stopping accuracy H, the temperature I, humidity J, vibration K, magnetic field L, electric field M, and degree of vacuum N (in the vacuum chamber) at each location in the microscope, the operating time O of the microscope, and the charge state P of the sample. The measured values of these device state parameters are stored in the device state parameter storage unit 302e of the tool-to-tool matching control apparatus 19.

There will now be specifically described step S53 of FIG. 19 that estimates a factor(s) that has caused a tool-to-tool disparity. This step is performed by the tool-to-tool-disparity causing factor analyzing section 301e in the tool-to-tool disparity control apparatus 19. The tool-to-tool-disparity causing factor analyzing section 301e determines the correlation between the CD values measured by the microscopes 18 and stored in the measured dimension storage unit 302a of the tool-to-tool matching control apparatus 19 and the values of each device state parameter measured at step S51 of FIG. 19 and stored in the device state parameter storage unit 302e. If these measured CD values and values of a device state parameter have a higher correlation than a threshold value, the tool-to-tool-disparity causing factor analyzing section 301e determines that the tool-to-tool disparity causing factor indicated by this device state parameter has caused the tool-to-tool disparity.

It should be noted that principal component analysis or other technique for evaluating the dependence of CD values on a device state parameter may be used instead of correlation evaluation between CD values and a device state parameter.

There will now be described step S50 of FIG. 19 that changes device control parameters. It should be noted that since the device state parameters A to H have the corresponding device control parameters, these corresponding device control parameters may be set so as to set the device state parameters A to H to desired values. On the other hand, the environmental indicators I to P are preferably automatically adjusted to desired values. However, if such an arrangement is difficult to implement, the input/output unit 303 of the tool-to-tool matching control apparatus 19 may send an alarm to notify the user of the situation. Further, the required amount of adjustment of each device control parameter may be determined as follows. (1) When a device control parameter needs to be adjusted, the required amount of adjustment is determined so as to minimize the value of the corresponding device state parameter or the tool-to-tool disparity. Alternatively, (2) the relationship between the amount of adjustment of each device control parameter and the amount of change in each device state parameter is found beforehand, and the required amount of adjustment of each device control parameter is determined based on this relationship. Information about the required amount of adjustment of each device control parameter is sent from the microscope control section 301d of the tool-to-tool matching control apparatus 19 to the control unit 215 of each microscope which then adjusts its device control parameters according to this information.

An exemplary input screen employed by this system will be described.

FIG. 8 shows an exemplary icon (or button) displayed by each scanning electron microscope 18, wherein the button is pressed by the user to obtain data for evaluation of tool-to-tool disparity causing factors. FIG. 9 shows an exemplary screen with an exemplary icon (or button) thereon displayed by the tool-to-tool matching control apparatus 19 before evaluation of tool-to-tool disparity causing factors, wherein: the screen is used to specify a scanning electron microscope(s) and data for evaluation of tool-to-tool disparity causing factors; and the button is pressed by the user to start the evaluation.

Figure 20:
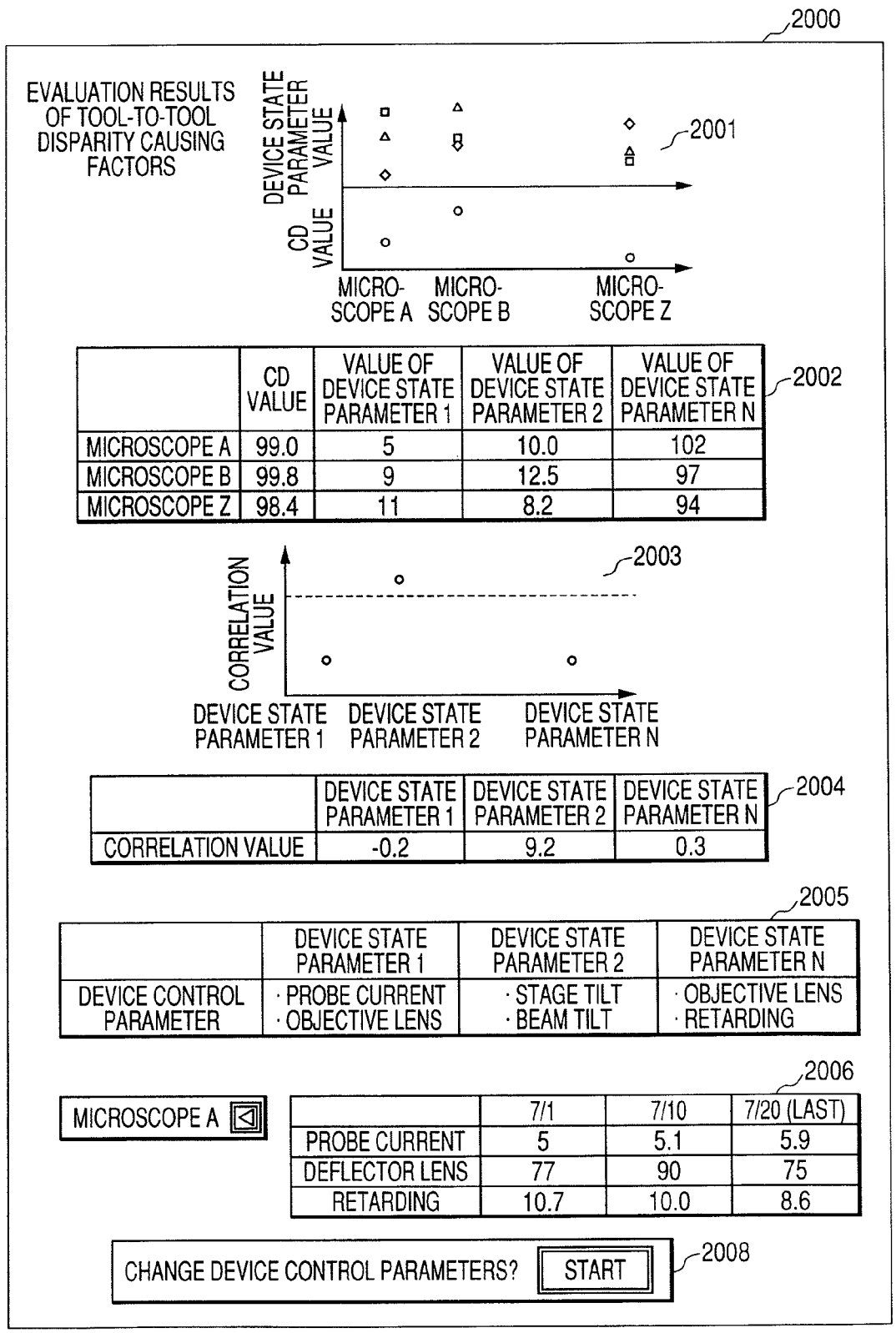
FIG. 20 is a diagram showing an exemplary output screen and exemplary input/output screens displayed by the tool-to-tool matching control system including scanning electron microscopes according to the second embodiment of the present invention, wherein: the output screen shows evaluation results of tool-to-tool disparity causing factors; and the input/output screens are used to automatically adjust the scanning electron microscopes based on information about candidate tool-to-tool disparity causing factors so as to reduce the tool-to-tool disparity.

Further, FIG. 20 includes exemplary output screens (2000) displayed by this system. Referring to the figure, reference numeral 2001 denotes a graph showing the relationship between dimension values or CD values (indicated by a circle) measured by microscopes A to Z and the values of a device state parameter 1 (indicated by a rhombus), the values of a device state parameter 2 (indicated by a triangle), ..., and the values of a device state parameter N (indicated by a square) exhibited by the microscopes A to Z. It should be noted that this graph is also considered to indicate the differences (or tool-to-tool disparities) between a CD value measured by a reference microscope and CD values measured by the microscopes A to Z and the differences between the values of the device state parameters 1 to N exhibited by the reference microscope and the values of the device state parameters 1 to N exhibited by the microscopes A to Z. Further, reference numeral 2002 denotes a table showing the same relationship as graph 2001. Further, reference numeral 2003 denotes a graph showing the correlation values of the device state parameters 1 to N with the dimension values (or CD values) measured by the microscopes A to Z. (The differences between these CD values constitute the tool-to-tool disparities between the microscopes A to Z.) It should be noted that this graph is also considered to indicate the correlation values of the device state parameters 1 to N with the differences (or tool-to-tool disparities) between a CD value measured by a reference microscope and CD values measured by the microscopes A to Z. Further, reference numeral 2004 denotes a table showing the same relationship as graph 2003. As shown in graph 2003 and table 2004, the device state parameter 2 has the highest correlation with the tool-to-tool disparity (or CD values). Therefore, change in the factor indicated by the device state parameter 2 is determined to have caused the tool-to-tool disparity. In this way, each (candidate) tool-to-tool disparity causing factor can be examined.

Further, FIG. 20 also includes exemplary input/output screens for automatically adjusting the scanning electron microscopes based on information about (candidate) tool-to-tool disparity causing factors so as to reduce the tool-to-tool disparity. Referring to the figure, reference numeral 2005 denotes a table showing the relationship between the device state parameters 1 to N and the candidate device control (or adjustment) parameters that may be adjusted when the factors indicated by these device state parameters have caused a tool-to-tool disparity. This relationship is stored in the storage unit 302 by the microscope control section 301d as a database beforehand. Further, reference numeral 2006 denotes a table showing, for example, changes in (or histories of) the values of some device control parameters of the microscope A. Further, reference numeral 2008 denotes an icon (or button) for changing device control parameters. (This button may or may not be selected depending on the output results.) Thus, the input/output unit 303 displays the input/output screens (2000), and the microscope control section 301d can select an appropriate device control parameter(s) for a factor that has caused the tool-to-tool disparity and adjust the selected device control parameter by an appropriate amount to eliminate the factor so as to correct or reduce the tool-to-tool disparity.

That is, the storage unit 302 stores a database storing the relationship between tool-to-tool disparity causing factors and device control parameters for adjusting these tool-to-tool disparity causing factors, and based on this relationship, the microscope control section 301d selects an appropriate device control parameter(s) for the tool-to-tool disparity causing factor displayed and output by the input/output unit 303 and instructs the control unit 215 of each microscope to automatically adjust the selected device control parameter(s) for the microscope by an appropriate amount to reduce the tool-to-tool disparity between the microscopes.

According to the present embodiment described above, it is possible to correct or reduce tool-to-tool disparities between microscopes.

Example 6

A sixth exemplary tool-to-tool matching control system of the present invention (according to the second embodiment) is different from that of Example 5 in that this system does not include a separate tool-to-tool matching control system 19 such as that of Example 5, but the scanning electron microscopes each includes a tool-to-tool matching control apparatus 19 instead, as shown in FIG. 12.

Example 7

A seventh exemplary tool-to-tool matching control system of the present invention (according to the second embodiment) is different from that of Example 5 in that the tool-to-tool matching control apparatus 19 is not connected to the scanning electron microscopes through the data bus (or network) 12, as shown in FIG. 14.

However, according to Example 7, device state parameter values and CD values can be supplied from each microscope to the tool-to-tool matching control apparatus 19 through its input/output unit 303, and the tool-to-tool matching control apparatus 19 can output an instruction to change a device control parameter(s) to a new value through the input/output unit 303. The processing within the tool-to-tool matching control apparatus 19 is the same as described in connection with Example 5.

Figure 21:
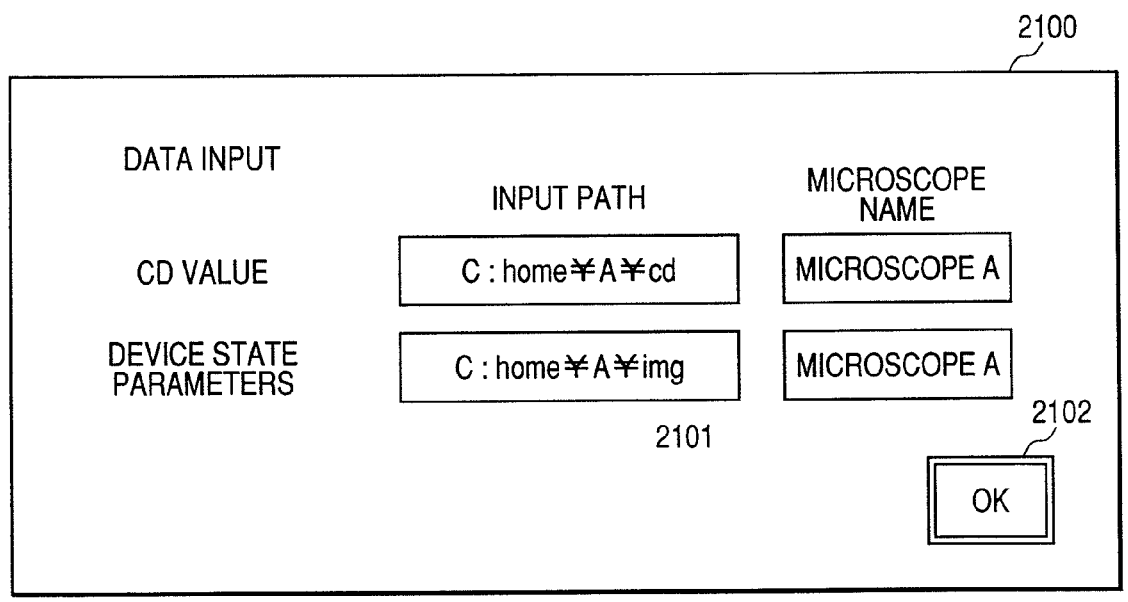
FIG. 21 is a diagram showing an exemplary screen for specifying a data storage method (or data storage locations) when entering dimension values (or CD values) of a target pattern measured by a plurality of scanning electron microscopes of the present invention and various device state parameters.

FIGS. 9 and 21 show exemplary input screens used by the tool-to-tool matching control system of Example 7. Specifically, FIG. 21 shows an exemplary input screen 2100 used when entering the dimension values (or CD values) of a target pattern measured by a plurality of scanning electron microscopes and values of each device state parameter exhibited by the microscopes. This screen is used to specify a data storage method, or data storage locations, and includes an input portion (or button) 2102 for entering the input data paths (2101) and information about the input data. FIG. 9 shows an exemplary screen with an exemplary icon (or button) thereon, wherein: the screen is used to specify a scanning electron microscope(s) and data for evaluation of tool-to-tool disparity causing factors; and the button is pressed by the user to start the evaluation.

This example also allows scanning electron microscopes to correct or reduce tool-to-tool disparities between them based on information on tool-to-tool disparity causing factors.

Third Embodiment

The first embodiment analyzes tool-to-tool disparity causing factors based on image features, and the second embodiment does such analysis using device state parameters, as described above. A third embodiment of the present invention, on the other hand, analyzes tool-to-tool disparity causing factors based on both image features and device state parameters.

Fourth Embodiment

The first to third embodiments of the present invention provide scanning electron microscope systems that can correct or reduce tool-to-tool disparities between the microscopes. The fourth embodiment of the present invention provides a variation of these scanning electron microscope systems which can estimate a factor(s) that has caused a variation in dimension measurements obtained by the same microscope at a series of times, that is, over time, and reduce such a variation. In this case, the horizontal axes of graphs 1001 and 2001 in FIGS. 10 and 20, respectively, must be changed so as to represent time. (Originally microscope reference numbers (A to Z) are plotted on these axes.) It should be noted that the scanning electron microscope system of the fourth embodiment is made up of at least one scanning electron microscope (10 or 18) and one tool-to-tool matching control apparatus (11 or 19).

Fifth Embodiment

The scanning electron microscope systems of first to fourth embodiment of the present invention can estimate a factor(s) that has caused a variation (or tool-to-tool disparity) in dimension measurements between measuring microscopes or variation in dimension measurements over time and automatically calibrate the microscopes based on the estimation results. On the other hand, a scanning electron microscope system of a fifth embodiment of the present invention does not automatically calibrate the microscopes. According to the fifth embodiment, the user may calibrate the microscopes based on the following information (displayed by the input/output unit 219 or 303 of the system): the tool-to-tool disparity or the variation in dimension measurements over time; the results of estimating a factor that has caused the tool-to-tool disparity or the variation; and the candidate device control parameter(s) to be adjusted and the required amount of adjustment determined based on the estimation results.

Sixth Embodiment

The tool-to-too matching control systems (or scanning electron microscopes systems) of the first to fifth embodiments of the present invention estimate a factor(s) that has caused a tool-to-tool disparity each time they measure the disparity. According to a sixth embodiment of the present invention, the frequency of this estimation may not be equal to the frequency of measurement of the tool-to-tool disparity.

Figure 22:
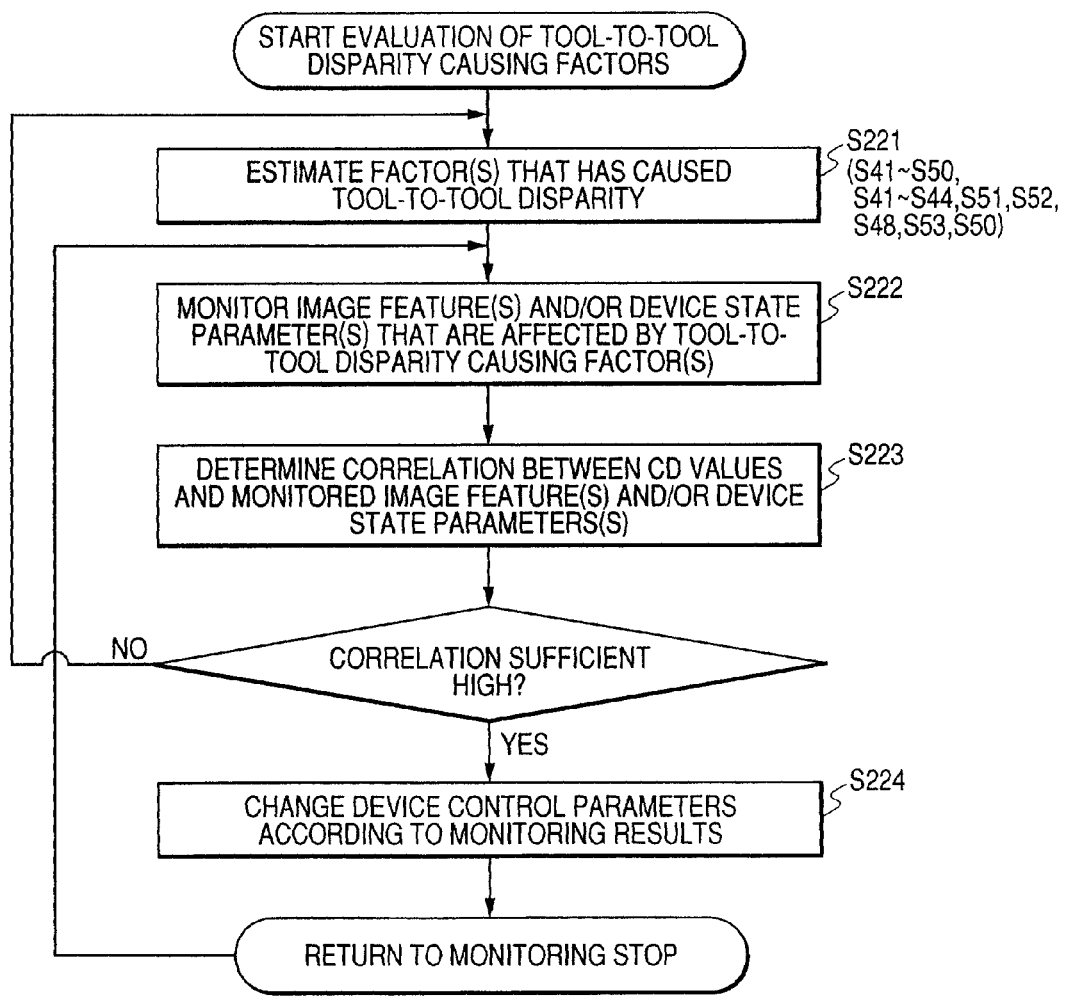
FIG. 22 is a diagram showing an entire process sequence for correcting a tool-to-tool disparity according to a sixth embodiment of the present invention.

FIG. 22 shows an entire sequence for correcting a tool-to-tool disparity according to the sixth embodiment.

In this sequence, first, steps S41 to S50 shown in FIG. 4 and/or steps S41 to S44, S51, S52, S48, S53, and S50 shown in FIG. 19 are performed at step S221 to estimate a factor(s) that has caused a tool-to-tool disparity. Then, at step 222, the tool-to-tool matching control apparatus 11 or 19 (or both) communicates with each microscope 10 or 18 (or both) and thereby monitors the values of the image feature(s) and/or device state parameter(s) (exhibited by the microscope) that are affected by the tool-to-tool disparity causing factor(s) estimated at step 221. If the tool-to-tool disparity is found to be still larger than the maximum allowable value, the microscope control section 301d calibrates each microscope at step S224 by instructing the control unit 215 of the microscope to adjust the device control parameters of the microscope according to the monitoring results. More specifically, the tool-to-tool-disparity causing factor analyzing section 301c or 301e determines the correlation between the dimension values (or CD values) measured by the microscopes and the values of each monitored image feature and/or device state parameter (exhibited by the microscopes) at step S223. If their correlation is low, the (candidate) tool-to-tool disparity causing factors must be newly analyzed to estimate a factor that has caused the disparity again. In such a case, the process returns to step S221 at which the tool-to-tool matching control apparatus 11 or 19 (or both) estimates a factor(s) that has caused the tool-to-tool disparity again. Then, at step 222, the tool-to-tool matching control apparatus 11 or 19 (or both) monitors the values of the image feature(s) and/or device state parameter(s) (exhibited by the microscopes) that are affected by the tool-to-tool disparity causing factor(s) determined at step 221. If the tool-to-tool disparity is found to be still larger than the maximum allowable value (and the correlation calculated at step S223 is high), the microscope control section 301d calibrates each microscope at step S224 by instructing the control unit 215 of the microscope to adjust the device control parameters for the microscope according to the monitoring results. These steps are repeated until the entire processing is complete.

As described above, the first to sixth embodiments of the present invention provide scanning electron microscopes, tool-to-tool matching control systems containing scanning electron microscopes, and tool-to-tool matching control apparatuses for scanning electron microscopes capable of quickly estimating a factor(s) that has caused a tool-to-tool disparity between scanning electron microscopes and adjusting the microscopes based on the estimation results to reduce the disparity. This leads to highly accurate control of the dimensions of patterns and hence to enhanced performance of the product.

The invention may be embodied in other specific forms without departing from the spirit or essential characteristics thereof. The present embodiments are therefore to be considered in all aspects as illustrative and not restrictive, the scope of the invention being indicated by the appended claims rather than by the foregoing description, and all changes which come within the meaning and range of equivalency of the claims are therefore intended to be embraced therein.

The invention claimed is:

1. A system for controlling a tool-to-tool disparity between a plurality of scanning electron microscopes, comprising:
a measuring unit for measuring a tool-to-tool disparity between plural scanning electron microscopes based on information extracted from secondary electron images which are captured by imaging a reference pattern formed on a wafer by using each of said plural scanning electron microscopes,
a tool state monitoring unit for monitoring tool states of each of said plural scanning electron microscopes including at least one of a deflector lens current and an objective lens current of each of said plural scanning electron microscopes; and
an output unit for displaying on a screen a relationship between said tool-to-tool disparity between said plural scanning electron microscopes measured by said measuring unit and tool states of each of said plural scanning electron microscopes monitored by said tool state monitoring unit;
wherein said tool state monitoring unit monitors the tool states of each of said plural scanning electron microscopes while imaging said reference pattern formed on the wafer by using each of said plural scanning electron microscopes.

2. The system as claimed in claim 1, wherein said measuring unit measures said tool-to-tool disparity between said plural scanning electron microscopes in accordance with image features extracted from said secondary electron images.

3. The system as claimed in claim 2, wherein said image features extracted from said secondary electron images include at least one of an image brightness, an image contrast, an image noise, a pattern dimension, a pattern feature, a resolution indicator value calculated from said image, and an axial alignment indicator value calculated from said image.

4. The system as claimed in claim 1, wherein said tool states monitored by said tool state monitoring unit further including device state parameters of components constituting said scanning electron microscopes.

5. The system as claimed in claim 4, wherein said device state parameters include at least one of an electron gun voltage and current or probe current, a retarding current and voltage, and a booster current and voltage.

6. The system as claimed in claim 1, further comprising:
a microscope control unit for selecting a device control parameter based on a tool-to-tool disparity causing factor output from said output unit, and for automatically adjusting said selected device control parameter for each microscope by an amount sufficient to reduce said tool-to-tool disparity between said microscopes.

7. The system as claimed in claim 1, further comprising:
a database for storing a relationship between tool-to-tool disparity causing factors and device control parameters for adjusting said tool-to-tool disparity causing factors; and
a microscope control unit for, based on said relationship stored in said database, selecting a device control parameter for said tool-to-tool disparity causing factor output from said output unit, and for automatically adjusting said selected device control parameter for each microscope by an amount sufficient to reduce said tool-to-tool disparity between said microscopes.

* * * * *